US012802941B2

(12) United States Patent
Guo et al.

(10) Patent No.: US 12,802,941 B2
(45) Date of Patent: Nov. 17, 2026

(54) INCREASING PLASMA UNIFORMITY IN A RECEPTACLE

(71) Applicant: Lam Research Corporation, Fremont, CA (US)

(72) Inventors: Tongtong Guo, Beaverton, OR (US); Rachel E. Batzer, Tigard, OR (US); Huatan Qiu, Portland, OR (US); Lee Chen, Cedar Creek, TX (US); Bo Gong, Sherwood, OR (US); Zhe Gui, Beaverton, OR (US)

(73) Assignee: Lam Research Corporation, Fremont, CA (US)

( * ) Notice: Subject to any disclaimer, the term of this patent is extended or adjusted under 35 U.S.C. 154(b) by 444 days.

(21) Appl. No.: 17/997,802

(22) PCT Filed: Apr. 30, 2021

(86) PCT No.: PCT/US2021/030177
§ 371 (c)(1),
(2) Date: Nov. 2, 2022

(87) PCT Pub. No.: WO2021/225890
PCT Pub. Date: Nov. 11, 2021

(65) Prior Publication Data

US 2023/0223238 A1 Jul. 13, 2023

Related U.S. Application Data

(60) Provisional application No. 63/019,563, filed on May 4, 2020.

(51) Int. Cl.
*H01J 37/32* (2006.01)

(52) U.S. Cl.
CPC .. *H01J 37/32449* (2013.01); *H01J 37/32357* (2013.01); *H01J 2237/3321* (2013.01); *H01J 2237/3323* (2013.01)

(58) Field of Classification Search
None
See application file for complete search history.

(56) References Cited

U.S. PATENT DOCUMENTS

| | | | |
|---|---|---|---|
| 3,995,237 | A | 11/1976 | Brunner |
| 4,044,357 | A | 8/1977 | Goldie |

(Continued)

FOREIGN PATENT DOCUMENTS

| | | | |
|---|---|---|---|
| CN | 1233147 | A | 10/1999 |
| CN | 1619767 | A | 5/2005 |

(Continued)

OTHER PUBLICATIONS

Chinese First Office Action dated Aug. 27, 2015 issued in Application No. CN 201310467492.0.

(Continued)

*Primary Examiner* — Wilson Lee
(74) *Attorney, Agent, or Firm* — Weaver Austin Villeneuve & Sampson LLP

(57) ABSTRACT

An apparatus for forming a plasma may include one or more coupling ports to accept an RF current. The apparatus may additionally include a receptacle to accommodate one or more gases, in which the receptacle is oriented along a first axis. The apparatus may additionally include an RF coupling structure, oriented in a plane and substantially surrounding the receptacle, the RF coupling structure can be configured to conduct an RF current to bring about formation of the plasma within the receptacle. The apparatus may further include one or more linkages, coupled to the RF coupling structure, which may permit the plane of the RF coupling structure to pivot about a second axis so as to tilt the plane of the RF coupling structure toward the first axis.

20 Claims, 6 Drawing Sheets

(56) References Cited

U.S. PATENT DOCUMENTS 4,316,254 A 2/1982 Levin
5,130,678 A 7/1992 Edwards
5,155,547 A 10/1992 Casper et al.
5,195,045 A 3/1993 Keane et al.
5,314,603 A 5/1994 Sugiyama et al.
5,369,795 A 11/1994 Yanagimoto
5,499,384 A 3/1996 Lentz et al.
5,572,170 A 11/1996 Collins et al.
5,580,385 A 12/1996 Paranjpe et al.
5,643,364 A 7/1997 Zhao et al.
5,770,922 A 6/1998 Gerrish et al.
5,866,985 A 2/1999 Coultas et al.
5,897,713 A 4/1999 Tomioka et al.
6,020,794 A 2/2000 Wilbur
6,028,014 A 2/2000 Sukjarev
6,054,013 A 4/2000 Collins et al.
6,068,784 A 5/2000 Collins et al.
6,239,587 B1 5/2001 Buck
6,251,792 B1 6/2001 Collins et al.
6,288,493 B1 9/2001 Lee et al.
6,339,206 B1 1/2002 Johnson
6,367,410 B1 * 4/2002 Leahey ............... H10P 72/0432 118/724
6,388,226 B1 5/2002 Smith et al.
6,444,137 B1 9/2002 Collins et al.
6,447,636 B1 9/2002 Qian et al.
6,518,195 B1 2/2003 Collins et al.
6,632,324 B2 10/2003 Chan
6,815,633 B1 11/2004 Chen et al.
6,833,050 B2 12/2004 Jeon et al.
6,887,339 B1 5/2005 Goodman et al.
6,922,324 B1 7/2005 Horwitz
6,939,434 B2 9/2005 Collins et al.
7,042,311 B1 5/2006 Hilliker et al.
7,777,152 B2 8/2010 Todorov et al.
8,179,050 B2 5/2012 Chen
8,187,416 B2 5/2012 Miller et al.
8,190,380 B2 5/2012 Choueiry et al.
8,282,983 B1 10/2012 Kapoor et al.
8,368,308 B2 2/2013 Banna et al.
8,485,127 B2 7/2013 Nishimoto et al.
8,617,351 B2 12/2013 Hoffman et al.
8,823,357 B2 9/2014 Shafer et al.
9,082,589 B2 7/2015 Thomas et al.
9,518,554 B2 12/2016 Mongin et al.
9,526,161 B2 12/2016 Habu
9,596,744 B2 3/2017 Leeser
9,704,692 B2 7/2017 Leeser
9,773,643 B1 9/2017 Singhal et al.
9,779,196 B2 10/2017 Valcore, Jr. et al.
9,859,088 B2 1/2018 Shaikh
9,918,376 B2 3/2018 Thomas et al.
10,187,032 B2 1/2019 Kapoor et al.
10,224,184 B2 3/2019 Van Zyl
10,269,540 B1 4/2019 Carter et al.
10,304,663 B1 5/2019 Kapoor et al.
10,354,838 B1 7/2019 Mopidevi et al.
10,388,485 B2 8/2019 Shaikh
10,553,465 B2 2/2020 Augustyniak et al.
10,825,655 B1 * 11/2020 Lee ...................... H01J 37/3211
10,950,421 B2 3/2021 Valcore, Jr.
11,527,385 B2 12/2022 Maw et al.
11,756,768 B2 9/2023 Hasegawa et al.
11,984,298 B2 5/2024 Juco et al.
11,994,542 B2 5/2024 Kapoor et al.
12,136,938 B2 11/2024 Juco et al.
12,205,796 B2 1/2025 Kapoor
12,283,462 B2 4/2025 Mopidevi et al.
12,626,895 B2 5/2026 Kapoor et al.
2001/0042594 A1 11/2001 Shamouilian et al.
2001/0054383 A1 12/2001 Pu et al.
2002/0023899 A1 2/2002 Khater et al.
2002/0038688 A1 4/2002 Nakano et al.
2002/0129904 A1 9/2002 Itabashi et al.
2002/0180534 A1 12/2002 Bohn et al.
2003/0046013 A1 3/2003 Gerrish
2003/0106645 A1 6/2003 Ni et al.
2003/0141821 A1 7/2003 Nakano et al.
2003/0146803 A1 8/2003 Pickard et al.
2003/0157812 A1 8/2003 Narwankar et al.
2004/0032212 A1 2/2004 Yuzurihara et al.
2004/0116080 A1 6/2004 Chen et al.
2004/0195972 A1 10/2004 Cornelius
2004/0236524 A1 11/2004 Mundt
2004/0253921 A1 12/2004 Turner
2005/0001556 A1 1/2005 Hoffman et al.
2005/0069651 A1 3/2005 Miyoshi et al.
2005/0106873 A1 5/2005 Hoffman et al.
2005/0134186 A1 6/2005 Brouk et al.
2005/0161769 A1 7/2005 Coolbaugh et al.
2005/0205532 A1 9/2005 Patrick et al.
2006/0116106 A1 6/2006 Turner
2007/0153780 A1 7/2007 Stanley
2007/0166134 A1 7/2007 Suzuki
2007/0251920 A1 11/2007 Hoffman
2007/0256787 A1 * 11/2007 Chandrachood ...... H01J 37/321 156/345.48
2007/0275486 A1 * 11/2007 Hiroki ................... H01L 21/681 414/800
2008/0106206 A1 5/2008 Hooke et al.
2008/0179948 A1 7/2008 Nagarkatti et al.
2008/0264904 A1 10/2008 Yuen et al.
2009/0037999 A1 2/2009 Anderson et al.
2009/0162570 A1 6/2009 Swenberg et al.
2009/0250334 A1 * 10/2009 Qiu .................... H01J 37/32119 156/345.48
2009/0255800 A1 10/2009 Koshimizu
2009/0278512 A1 11/2009 Karlicek et al.
2009/0289630 A1 11/2009 Nascimento et al.
2010/0025384 A1 2/2010 Todorow et al.
2010/0171427 A1 7/2010 Kirchmeier et al.
2010/0243162 A1 9/2010 Koshimizu
2010/0276391 A1 11/2010 Grimbergen et al.
2011/0063042 A1 3/2011 Mendolia et al.
2011/0101862 A1 5/2011 Koo et al.
2011/0140607 A1 6/2011 Moore et al.
2011/0148303 A1 6/2011 Van Zyl et al.
2011/0214811 A1 9/2011 Ashida
2012/0073757 A1 3/2012 Yamazawa
2012/0074844 A1 3/2012 York et al.
2012/0212135 A1 8/2012 Suzuki
2012/0247679 A1 10/2012 Yamazawa
2012/0298303 A1 * 11/2012 Ikeda ....................... H05H 1/46 156/345.48
2013/0076343 A1 3/2013 Carpenter et al.
2013/0105082 A1 5/2013 Melikyan et al.
2013/0197874 A1 8/2013 Heckel
2013/0234741 A1 9/2013 Mow et al.
2013/0256271 A1 10/2013 Panagopoulos et al.
2014/0008357 A1 1/2014 Cheng et al.
2014/0062303 A1 3/2014 Hoffman et al.
2014/0087668 A1 3/2014 Mow et al.
2014/0097751 A1 4/2014 Thomas et al.
2014/0155008 A1 6/2014 Van Zyl
2014/0214350 A1 7/2014 Valcore, Jr. et al.
2014/0231389 A1 8/2014 Nagami et al.
2014/0232483 A1 8/2014 Correa et al.
2014/0367043 A1 12/2014 Bishara et al.
2015/0037972 A1 2/2015 Danek et al.
2015/0221478 A1 8/2015 Himori et al.
2015/0235811 A1 8/2015 Cooperberg et al.
2015/0255242 A1 * 9/2015 Divergilio ........... H01J 37/3171 250/424
2015/0255994 A1 9/2015 Kesler et al.
2015/0313000 A1 10/2015 Thomas et al.
2015/0318146 A1 11/2015 Kim
2015/0319837 A1 11/2015 Bhutta
2015/0332894 A1 11/2015 Valcore, Jr. et al.
2015/0340204 A1 11/2015 Kudela et al.
2015/0348854 A1 12/2015 Kapoor et al.
2015/0357210 A1 12/2015 Mori et al.
2015/0371832 A1 12/2015 Yanai et al.
2015/0371876 A1 12/2015 Terauchi et al.
2016/0065207 A1 3/2016 Bhutta

(56) References Cited

U.S. PATENT DOCUMENTS

| | | | |
|---|---|---|---|
| 2016/0087687 | A1 | 3/2016 | Kesler et al. |
| 2016/0113103 | A1 | 4/2016 | Van Zyl |
| 2016/0181866 | A1 | 6/2016 | Moeskops |
| 2016/0233047 | A1* | 8/2016 | Tang ........................ H05H 3/02 |
| 2016/0295677 | A1 | 10/2016 | Leeser |
| 2016/0322215 | A1 | 11/2016 | Shaikh |
| 2016/0351375 | A1 | 12/2016 | Valcore, Jr. et al. |
| 2017/0004955 | A1 | 1/2017 | Leeser |
| 2017/0062187 | A1 | 3/2017 | Radomski et al. |
| 2017/0076917 | A1* | 3/2017 | Yudovsky ......... H01J 37/32651 |
| 2017/0117869 | A1 | 4/2017 | Leeser et al. |
| 2017/0121819 | A1* | 5/2017 | Swaminathan ..... C23C 16/4585 |
| 2017/0213702 | A1* | 7/2017 | Hammond, IV .. H01J 37/32174 |
| 2017/0213758 | A1* | 7/2017 | Rice .................. H01J 37/32082 |
| 2017/0236693 | A1 | 8/2017 | Kobayashi et al. |
| 2017/0244582 | A1 | 8/2017 | Gal et al. |
| 2017/0256416 | A1 | 9/2017 | Fischer et al. |
| 2017/0330732 | A1 | 11/2017 | Valcore, Jr. et al. |
| 2017/0330744 | A1 | 11/2017 | Keil et al. |
| 2017/0345620 | A1 | 11/2017 | Coumou et al. |
| 2017/0365907 | A1 | 12/2017 | Kapoor et al. |
| 2017/0372870 | A1 | 12/2017 | Godyak et al. |
| 2018/0023158 | A1 | 1/2018 | Sasaki et al. |
| 2018/0025930 | A1 | 1/2018 | Augustyniak et al. |
| 2018/0068834 | A1 | 3/2018 | Valcore, Jr. et al. |
| 2018/0097520 | A1 | 4/2018 | Wu |
| 2018/0130696 | A1 | 5/2018 | Konkola et al. |
| 2018/0144903 | A1 | 5/2018 | Shaikh |
| 2018/0163302 | A1 | 6/2018 | Kapoor et al. |
| 2018/0231587 | A1 | 8/2018 | Ye et al. |
| 2018/0233326 | A1* | 8/2018 | Tan ..................... C23C 16/4585 |
| 2018/0261431 | A1 | 9/2018 | Hammond, IV et al. |
| 2018/0308663 | A1 | 10/2018 | Collins et al. |
| 2018/0308664 | A1 | 10/2018 | Collins et al. |
| 2018/0350649 | A1 | 12/2018 | Gomm |
| 2018/0351322 | A1 | 12/2018 | Kurosawa et al. |
| 2018/0366304 | A1* | 12/2018 | Shim ................. H01L 21/67069 |
| 2018/0366378 | A1 | 12/2018 | Kim et al. |
| 2019/0013222 | A1 | 1/2019 | Kim et al. |
| 2019/0049534 | A1 | 2/2019 | Guan |
| 2019/0051496 | A1 | 2/2019 | Collins et al. |
| 2019/0068158 | A1 | 2/2019 | Coumou et al. |
| 2019/0108979 | A1 | 4/2019 | Higuchi |
| 2019/0148118 | A1* | 5/2019 | Zhang ............... H01J 37/32522 156/345.26 |
| 2019/0149119 | A1 | 5/2019 | Kapoor et al. |
| 2019/0198345 | A1 | 6/2019 | Fischer et al. |
| 2019/0228950 | A1 | 7/2019 | Funk et al. |
| 2019/0288737 | A1 | 9/2019 | Hanks et al. |
| 2019/0391547 | A1 | 12/2019 | Coumou et al. |
| 2020/0010957 | A1 | 1/2020 | Chen et al. |
| 2020/0105573 | A1* | 4/2020 | Schaller ............ H01L 21/68764 |
| 2020/0118792 | A1 | 4/2020 | Mopidevi et al. |
| 2020/0118856 | A1 | 4/2020 | Augustyniak et al. |
| 2020/0126762 | A1 | 4/2020 | Yang et al. |
| 2020/0161104 | A1 | 5/2020 | Ni et al. |
| 2020/0194235 | A1* | 6/2020 | Kim ................. H01J 37/32724 |
| 2020/0211873 | A1 | 7/2020 | Zhao et al. |
| 2020/0333434 | A1 | 10/2020 | Chancey et al. |
| 2020/0381213 | A1 | 12/2020 | Lian et al. |
| 2020/0411286 | A1 | 12/2020 | Koshimizu et al. |
| 2021/0005474 | A1 | 1/2021 | Hong |
| 2021/0090935 | A1* | 3/2021 | Koai ................. H01L 21/68721 |
| 2021/0098233 | A1 | 4/2021 | Kapoor et al. |
| 2021/0159107 | A1 | 5/2021 | Woo |
| 2021/0183619 | A1 | 6/2021 | Patrick et al. |
| 2021/0302478 | A1 | 9/2021 | Kapoor et al. |
| 2021/0313948 | A1 | 10/2021 | Leeser et al. |
| 2022/0190854 | A1 | 6/2022 | Juco et al. |
| 2022/0328236 | A1 | 10/2022 | Kapoor |
| 2022/0344129 | A1 | 10/2022 | Kapoor |
| 2022/0375721 | A1 | 11/2022 | Fields et al. |
| 2022/0415616 | A1 | 12/2022 | Juco et al. |
| 2023/0052543 | A1 | 2/2023 | Linebarger, Jr. et al. |
| 2023/0326720 | A1 | 10/2023 | Mopidevi et al. |
| 2024/0047291 | A1 | 2/2024 | Won et al. |
| 2024/0203711 | A1 | 6/2024 | Kapoor et al. |
| 2024/0258073 | A1 | 8/2024 | Juco et al. |
| 2024/0272210 | A1 | 8/2024 | Kapoor et al. |
| 2025/0015819 | A1 | 1/2025 | Juco et al. |
| 2025/0038034 | A1 | 1/2025 | Topping et al. |
| 2025/0118533 | A1 | 4/2025 | Kapoor |
| 2025/0132127 | A1 | 4/2025 | Guo et al. |
| 2025/0246406 | A1 | 7/2025 | Dehghan et al. |
| 2026/0213144 | A1 | 7/2026 | Kapoor et al. |

FOREIGN PATENT DOCUMENTS

| | | | |
|---|---|---|---|
| CN | 1656593 | A | 8/2005 |
| CN | 1925322 | A | 3/2007 |
| CN | 101630624 | A | 1/2010 |
| CN | 101866808 | A | 10/2010 |
| CN | 101933225 | A | 12/2010 |
| CN | 102037789 | A | 4/2011 |
| CN | 102272869 | A | 12/2011 |
| CN | 103533690 | A | 1/2014 |
| CN | 105321792 | A | 2/2016 |
| CN | 107419238 | A | 12/2017 |
| CN | 108109897 | A | 6/2018 |
| CN | 108494381 | A | 9/2018 |
| CN | 109036817 | A | 12/2018 |
| CN | 109659215 | A | 4/2019 |
| CN | 112753089 | A | 5/2021 |
| EP | 0840350 | A2 | 5/1998 |
| EP | 0935406 | A2 | 8/1999 |
| EP | 0731559 | B1 | 11/2001 |
| EP | 2881579 | A1 | 6/2015 |
| EP | 2881579 | B1 | 3/2019 |
| GB | 1599557 | A | 10/1981 |
| JP | H0589997 | A | 4/1993 |
| JP | H08274067 | A | 10/1996 |
| JP | H10125497 | A | 5/1998 |
| JP | H11233294 | A | 8/1999 |
| JP | 2001057360 | A | 2/2001 |
| JP | 2001249028 | A | 9/2001 |
| JP | 2003517197 | A | 5/2003 |
| JP | 2003302431 | A | 10/2003 |
| JP | 2004031566 | A | 1/2004 |
| JP | 2004266038 | A | 9/2004 |
| JP | 2005527078 | A | 9/2005 |
| JP | 2006019716 | A | 1/2006 |
| JP | 2006209976 | A | 8/2006 |
| JP | 2006286814 | A | 10/2006 |
| JP | 2008276984 | A | 11/2008 |
| JP | 4352562 | B2 | 10/2009 |
| JP | 2010065240 | A | 3/2010 |
| JP | 2011096690 | A | 5/2011 |
| JP | 2011515790 | A | 5/2011 |
| JP | 2011135766 | A | 7/2011 |
| JP | 2011222292 | A | 11/2011 |
| JP | 2012033958 | A | 2/2012 |
| JP | 2013216949 | A | 10/2013 |
| JP | 5491109 | B2 | 5/2014 |
| JP | 2014099585 | A | 5/2014 |
| JP | 2014142266 | A | 8/2014 |
| JP | 2014186944 | A | 10/2014 |
| JP | 2014186994 | A | 10/2014 |
| JP | 5812561 | B2 | 11/2015 |
| JP | 2016009733 | A | 1/2016 |
| JP | 2016184924 | A | 10/2016 |
| JP | 2017510059 | A | 4/2017 |
| JP | 2017143057 | A | 8/2017 |
| JP | 2017168298 | A | 9/2017 |
| JP | 2017199904 | A | 11/2017 |
| JP | 2017224601 | A | 12/2017 |
| JP | 2018011050 | A | 1/2018 |
| JP | 2018022685 | A | 2/2018 |
| JP | 2019504481 | A | 2/2019 |
| JP | 2019071270 | A | 5/2019 |
| JP | 2019517125 | A | 6/2019 |
| JP | 2019133785 | A | 8/2019 |
| JP | 2020510959 | A | 4/2020 |
| JP | 2021503183 | A | 2/2021 |
| JP | 2021052062 | A | 4/2021 |

(56) References Cited

FOREIGN PATENT DOCUMENTS

| | | | |
|---|---|---|---|
| JP | 2021515197 | A | 6/2021 |
| KR | 980012069 | A | 4/1998 |
| KR | 19980012069 | U | 5/1998 |
| KR | 20010015590 | A | 2/2001 |
| KR | 20020081228 | A | 10/2002 |
| KR | 20030034108 | A | 5/2003 |
| KR | 20040084477 | A | 10/2004 |
| KR | 20050029122 | A | 3/2005 |
| KR | 20060105668 | A | 10/2006 |
| KR | 20070101654 | A | 10/2007 |
| KR | 20070109275 | A | 11/2007 |
| KR | 20090009681 | U | 9/2009 |
| KR | 20110116939 | A | 10/2011 |
| KR | 20120032449 | A | 4/2012 |
| KR | 20120087925 | A | 8/2012 |
| KR | 20130047532 | A | 5/2013 |
| KR | 101415551 | B1 | 7/2014 |
| KR | 20140104380 | A | 8/2014 |
| KR | 20140118912 | A | 10/2014 |
| KR | 20150039725 | A | 4/2015 |
| KR | 20150139461 | A | 12/2015 |
| KR | 20160000400 | A | 1/2016 |
| KR | 20170054239 | A | 5/2017 |
| KR | 101791706 | B1 | 10/2017 |
| KR | 20170114800 | A | 10/2017 |
| KR | 20180080631 | A | 7/2018 |
| KR | 20180082626 | A | 7/2018 |
| KR | 20180101243 | A | 9/2018 |
| KR | 20190047404 | A | 5/2019 |
| KR | 20190109559 | A | 9/2019 |
| KR | 20200001608 | A | 1/2020 |
| KR | 20200003561 | A | 1/2020 |
| KR | 20200111233 | A | 9/2020 |
| KR | 102505150 | B1 | 2/2023 |
| KR | 20230078792 | A | 6/2023 |
| TW | 200509194 | A | 3/2005 |
| TW | 200518210 | A | 6/2005 |
| TW | I290331 | B | 11/2007 |
| TW | 200915717 | A | 4/2009 |
| TW | 201141317 | A | 11/2011 |
| TW | 201143546 | A | 12/2011 |
| TW | 201611153 | A | 3/2016 |
| TW | 201613422 | A | 4/2016 |
| TW | 201808057 | A | 3/2018 |
| TW | 201840989 | A | 11/2018 |
| TW | 201903818 | A | 1/2019 |
| TW | 201920733 | A | 6/2019 |
| TW | 201935596 | A | 9/2019 |
| TW | 202016974 | A | 5/2020 |
| TW | 202020925 | A | 6/2020 |
| TW | 202107516 | A | 2/2021 |
| TW | 202111812 | A | 3/2021 |
| WO | WO-9534945 | A2 | 12/1995 |
| WO | WO-9914855 | A1 | 3/1999 |
| WO | WO-0219387 | A2 | 3/2002 |
| WO | WO-02080220 | A1 | 10/2002 |
| WO | WO-02084698 | A1 | 10/2002 |
| WO | WO-03101160 | A2 | 12/2003 |
| WO | WO-2005031839 | A1 | 4/2005 |
| WO | WO-2009099486 | A1 | 8/2009 |
| WO | WO-2011028600 | A2 | 3/2011 |
| WO | WO-2017100136 | A1 | 6/2017 |
| WO | WO-2018156486 | A1 | 8/2018 |
| WO | WO-2018228133 | A1 | 12/2018 |
| WO | WO-2019079325 | A1 | 4/2019 |
| WO | WO-2019165296 | A1 | 8/2019 |
| WO | WO-2020076413 | A1 | 4/2020 |
| WO | WO-2021081304 | A1 | 4/2021 |
| WO | WO-2023177409 | A1 | 9/2023 |

OTHER PUBLICATIONS

Chinese First Office Action dated May 17, 2017 issued in Application No. CN 201610428220.3.

Chinese Second Office Action dated Mar. 5, 2018 issued in Application No. CN 201610428220.3.

Chinese Third Office Action dated Aug. 15, 2018 issued in Application No. CN 201610428220.3.

Final Office Action dated Jul. 7, 2017 issued in U.S. Appl. No. 14/737,377.

International Preliminary Report on Patentability and written opinion dated Aug. 25, 2022 in Application PCT/US2021/017227.

International Preliminary Report on Patentability and written opinion dated Nov. 17, 2022 in Application PCT/US2021/030177.

International Preliminary Report on Patentability dated Dec. 22, 2022, in PCT Application No. PCT/US2021/036163.

International Preliminary Report on Patentability dated Oct. 6, 2022 in PCT Application PCT/US2021/023942.

International Preliminary Report on Patentability dated Apr. 14, 2022 from PCT/US2020/053014.

International Preliminary Report on Patentability dated Feb. 10, 2022 issued in Application No. PCT/US2020/070333.

International Preliminary Report on Patentability dated Jun. 16, 2022, in PCT Application No. PCT/US2020/062924.

International Preliminary Report on Patentability dated Nov. 18, 2021, issued in PCT/US2020/030835.

International Search Report and Written Opinion dated Apr. 7, 2021 issued in Application No. PCT/US2020/062924.

International Search Report and Written Opinion dated Aug. 17, 2021 issued in Application No. PCT/US2021/030177.

International Search Report and Written Opinion dated Aug. 21, 2020 issued in Application No. PCT/US2020/030835.

International Search Report and Written Opinion dated Dec. 16, 2022 in PCT Application No. PCT/US2022/030252.

International Search Report and Written Opinion dated Feb. 3, 2021 issued in Application No. PCT/US2020/057020.

International Search Report and Written Opinion dated Jan. 19, 2021, for International Application No. PCT/US2020/053014.

International Search Report and Written Opinion dated Jul. 15, 2021 issued in Application No. PCT/US2021/023942.

International Search Report and Written Opinion dated Jun. 4, 2021 issued in Application No. PCT/US2021/017227.

International Search Report and Written Opinion dated Nov. 11, 2020 issued in Application No. PCT/US2020/070333.

International Search Report and Written Opinion dated Sep. 27, 2021 issued in Application No. PCT/US2021/036163.

Korean Decision for Grant of Patent dated Jan. 18, 2020 issued in Application No. KR 10-2013-0120518.

KR Office Action dated Aug. 4, 2022 in Application No. KR10-2022-7013719 With English translation.

KR Office Action dated Sep. 21, 2022 in Application No. KR10-2022-7025826 with English translation.

Notice of Allowance dated Mar. 31, 2015 issued in U.S. Appl. No. 13/648,183.

Notice of Allowance dated Oct. 31, 2017 issued in U.S. Appl. No. 14/737,377.

Office Action dated Sep. 23, 2016 issued in U.S. Appl. No. 14/737,377.

PCT International Preliminary Report on Patentability dated May 5, 2022 issued in PCT/US2020/057020.

Taiwanese Notice of Allowance dated Jan. 19, 2017 issued in Application No. TW 102136597.

U.S. Appl. No. 17/760,159, Inventors Linebarger et al., filed Aug. 4, 2022.

U.S. Appl. No. 17/907,067, inventors Kapoor et al., filed Sep. 22, 2022.

CN Office Action dated Oct. 11, 2023, in application No. CN202080056165.4 with English translation.

CN Office Action dated Oct. 24, 2023, in application No. CN202080034447.4 with English translation.

CN Office Action dated Oct. 31, 2024 in CN Application No. 202080074587.4 with English translation.

International Preliminary Report on Patentability and Written Opinion dated Oct. 3, 2024 in PCT Application No. PCT/US2022/030252.

International Preliminary Report on Patentability dated Jan. 12, 2023, in PCT Application No. PCT/US2021/038457.

(56) References Cited

OTHER PUBLICATIONS

International Search Report and Written Opinion dated Oct. 14, 2021, in application No. PCT/US2021/038457.
JP Notice of Allowances dated Sep. 3, 2024 in JP Application No. 2022-506171 with English translation.
JP Notice of Allowances dated Sep. 10, 2024 in JP Application No. 2022-530889 with English translation.
JP Office Action dated Apr. 30, 2024 in JP Application No. 2022-506171, with English Translation.
JP Office Action dated Aug. 27, 2024 in JP Application No. 2022-547225 with English translation.
JP Office Action dated Jun. 11, 2024 in JP Application No. 2022-530889 with English translation.
JP Office Action dated Jun. 18, 2024 in JP Application No. 2022-523827 with English Translation.
JP Office Action dated May 7, 2024 in JP Application No. 2021-564697, with English Translation.
JP Office Action dated Oct. 1, 2024 in JP Application No. 2022-520163 with English translation.
KR Office Action dated Aug. 23, 2024 in KR Application No. 10-2023-7006703, with English Translation.
KR Office Action dated Feb. 24, 2023 in Application No. KR10-2022-7025826 with English translation.
KR Office Action dated Jan. 16, 2024 in KR Application No. 10-2023-7006703 with English translation.
KR Office Action dated May 21, 2024 in KR Application No. 10-2019-0071320, with English translation.
SG Search Report and Written Opinion dated Nov. 1, 2023 in SG Application No. 11202111969R.
SG Search Report and Written Opinion dated Nov. 15, 2023 in SG Application No. 11202202918X.
SG Search report dated Jul. 16, 2024 in Application No. SG11202205585V.
TW Office Action dated Apr. 3, 2024 in TW Application No. 109115006, with English Translation.
TW Office Action dated Aug. 2, 2024 in TW Application No. 109133629 with English translation.
TW Office Action dated May 9, 2024 in TW Application No. 109125947, with English Translation.
TW Office Action dated May 22, 2024 in TW Application No. 109136856, with English translation.
TW Office Action dated Oct. 11, 2024 in TW Application No. 109115006 with English translation.
TW Office Action dated Oct. 11, 2024 in TW Application No. 109125947 with English translation.
TW Office Action dated Sep. 23, 2024 in TW Application No. 110111059 with English translation.
U.S. Corrected Notice of Allowance dated Oct. 7, 2024 in U.S. Appl. No. 17/594,906.
U.S. Final Office Action dated Jun. 28, 2024 in U.S. Appl. No. 17/597,932.
U.S. Non-Final Office Action dated Dec. 21, 2023 in U.S. Appl. No. 17/594,906.
U.S. Non-Final Office Action dated Jul. 3, 2023, in U.S. Appl. No. 16/832,961.
U.S. Non-Final Office Action dated Jul. 5, 2024 in U.S. Appl. No. 18/000,895.
U.S. Non-Final Office Action dated Mar. 8, 2024 in U.S. Appl. No. 17/597,932.
U.S. Non-Final Office Action dated Nov. 13, 2024 in U.S. Appl. No. 18/631,368.
U.S. Notice of Allowance dated Feb. 6, 2024 in U.S. Appl. No. 16/832,961.
U.S. Notice of Allowance dated Jan. 12, 2024 in U.S. Appl. No. 17/756,058.
U.S. Notice of Allowance dated Jan. 23, 2024 in U.S. Appl. No. 17/756,058.
U.S. Notice of Allowance dated Jun. 20, 2024 in U.S. Appl. No. 17/594,906.
U.S. Notice of Allowance dated Oct. 20, 2023 in U.S. Appl. No. 16/832,961.
U.S. Notice of Allowance dated Sep. 18, 2024 in U.S. Appl. No. 17/597,932.
U.S. Appl. No. 18/847,308, inventors Dehghan S, et al., filed Sep. 16, 2024.
U.S. Appl. No. 18/890,408, inventors Juco E.Y, et al., filed Sep. 19, 2024.
U.S. Restriction Requirement dated Aug. 16, 2024 in U.S. Appl. No. 17/755,141.
U.S. Restriction requirement dated Aug. 23, 2024 in U.S. Appl. No. 17/907,067.
U.S. Restriction Requirement dated Feb. 24, 2023 in U.S. Appl. No. 16/832,961.
Andersson C.M., et al., "A Sic Varactor with Large Effective Tuning Range for Microwave Power Applications," IEEE Electron Device Letters, Jun. 2011, vol. 32(6), pp. 788-790.
Araujo D., et., "Diamond for electronics: Materials, processing and devices," Materials, 2021, vol. 14(22), pp. 1-25.
Brezeanu M., "Diamond Schottky Barrier Diodes," 2010, pp. 1-164.
CN Office Action dated Mar. 8, 2025 in CN Application No. 202080069268.4, with English Translation.
Hegazi E., et al., "Varactor Characteristics, Oscillator Tuning Curves, and AM-FM Conversion," IEEE Journal of Solid-State Circuits, Jun. 2003, vol. 38 (6), pp. 1033-1039.
Ibarra A., et al., "Wide Frequency Dielectric Properties of CVD Diamond," Diamond and Related Materials, Apr. 1997, vol. 6(5-7), pp. 856-859.
International Preliminary Report on Patentability and Written Opinion dated Aug. 15, 2024 in PCT Application No. PCT/US2023/011463.
International Preliminary Report on Patentability and Written Opinion dated Feb. 15, 2024 in PCT Application No. PCT/US2022/074608.
International Search Report and Written Opinion dated Jun. 2, 2023, in Application No. PCT/US2023/011463.
International Search Report and Written Opinion dated Nov. 18, 2022 in PCT Application No. PCT/US2022/074608.
Kalish R., "Doping of diamond," Carbon, 1999, vol. 37, pp. 781-785.
Kawarada H., et., "Wide Temperature K-700k) and High Voltage (~ V) Operation of C—H Diamond MOSFETs for Power Electronics Application," IEEE International Electron Devices Meeting, 2014, 4 Pages.
KR Notice of Allowance dated Nov. 28, 2024 in KR Application No. 10-2023-7006703, with English Translation.
KR Office Action dated Dec. 18, 2024 in KR Application No. 10-2022-7006928, with English Translation.
KR Office Action dated Feb. 19, 2025 in KR Application No. 10-2022-7022290, with English Translation.
KR Office Action dated Jan. 20, 2025 in KR Application No. 10-2022-7017491, with English Translation.
KR Office Action dated Mar. 13, 2025 in KR Application No. 20227030866, with English Translation.
Liao M., et al., Ultra-wide Bandgap Semiconductor Materials, Elsevier, 2019, 234 pages.
Makino T., et al., "Diamond Schottky P-n Diode with High Forward Current Density," Physica status solidi, 2009, pp. 2086-2090.
Masante C., "Diamond MOSFET for Power Electronics. Micro and Nanotechnologies/microelectronics," Universite grenoble alpes, 2019, 159 Pages.
Merchant S., et al., "Realization of High Breakdown Voltage ( 700 V) in Thin SOI Devices," IEEE Proceedings of the 3rd International Symposium on Power Semiconductor Devices and ICs, 1991, pp. 31-35.
Peatman W.C.B., et al., "Design and Fabrication of Heterostructure Varactor Diodes for Millimeter and Submillimeter Wave Multiplier Applications," Proceedings IEEE/Cornell Conference on Advanced Concepts in High Speed Semiconductor Devices and Circuits, 1991, pp. 49-57.
Rouger N., et al., "Design of Diamond Power Devices: Application to Schottky Barrier Diodes," Energies, 2019, vol. 12 (12), pp. 1-17.

(56) References Cited

OTHER PUBLICATIONS

Sudow M., et al., "Sic Varactors for Dynamic Load Modulation of High Power Amplifiers," IEEE electron device letters, 2008, vol. 29 (7), pp. 728-730.
TW Office Action and Search Report dated Apr. 9, 2025 in TW Application No. 110120724, with English Translation.
TW Office Action and Search Report dated Feb. 18, 2025 in TW Application No. 110115860, with English Translation.
Umezawa H., et al., "Diamond Schottky Barrier Diode for High-temperature, High-power, and Fast Switching Applications," Japanese Journal of Applied Physics, 2014, vol. 53 ,5 Pages.
U.S. Non-Final Office Action dated Mar. 6, 2025 in U.S. Appl. No. 17/907,067.
U.S. Notice of Allowance dated Apr. 14, 2025 in U.S. Appl. No. 18/631,368.
U.S. Notice of Allowance dated Dec. 16, 2024 in U.S. Appl. No. 18/000,895.
U.S. Restriction Requirement dated Apr. 10, 2025 in U.S. Appl. No. 17/760,159.
Volpe P.N., et al., "Extreme Dielectric Strength in Boron Doped Homoepitaxial Diamond," Applied Physics Letters, 2010, vol. 97, 4 Pages.
EP Extended European Search report dated Jul. 14, 2025 in EP Application No. 22854124.9.
JP Office Action dated Sep. 9, 2025 in JP Application No. 2024-172857, with English Translation.
KR Office Action dated Jul. 3, 2025 in KR Application No. 10-2022-7042490, with English Translation.
KR Office Action dated Oct. 21, 2025 in KR Application No. 10-2022-7030866, with English Translation.
SG Search Report and Written Opinion dated Aug. 12, 2025 in SG Application No. 11202253460Y.
SG Search Report and Written Opinion dated Aug. 18, 2025 in SG Application No. 11202254750X.
SG Search Report and Written Opinion dated Jun. 23, 2025 in SG Application No. 11202204256Y.
TW Office Action dated May 29, 2025 in TW Application No. 110111059, with English Translation.
TW Office Action dated Nov. 3, 2025 in TW Application No. 110111059, with English Translation.
US Non-Final Office Action dated Jun. 24, 2025 in U.S. Appl. No. 17/760,159.
U.S. Notice of Allowance dated Aug. 29, 2025 in U.S. Appl. No. 17/907,067.
U.S. Restriction Requirement dated May 23, 2025 in U.S. Appl. No. 17/754,202.
JP Office Action dated Feb. 10, 2026 in JP Application No. 2024-226845, with English Translation.
JP Office Action dated Feb. 17, 2026 in JP Application No. 2024555090, with English Translation.
KR Office Action dated Dec. 29, 2025 in KR Application No. 10-2024-7034530, with English Translation.
KR Office Action dated Jan. 19, 2026 in KR Application No. 10-2024-7007519, with English Translation.
TW Office Action and Search Report dated Feb. 12, 2026 in TW Application No. 111129498, with English Translation.
TW Office Action and Search Report dated Jan. 5, 2026 in TW Application No. 111119061, with English Translation.
U.S. Non-Final Office Action dated Feb. 4, 2026 in U.S. Appl. No. 18/847,308.
U.S. Non-Final Office Action dated Feb. 26, 2026 in U.S. Appl. No. 18/834,982.
U.S. Notice of Allowance dated Feb. 18, 2026 in U.S. Appl. No. 17/907,067.
JP Office Action dated May 26, 2026 in JP Application No. 2024-505516, with English Translation.
TW Office Action dated Mar. 13, 2026 in TW Application No. 114125016, with English Translation.
U.S. Non-Final Office Action dated Mar. 17, 2026 in U.S. Appl. No. 18/982,327.
U.S. Notice of Allowance dated May 6, 2026 in U.S. Appl. No. 18/681,489.
U.S. Appl. No. 19/577,075, inventors Kapoor S et al., filed Mar. 24, 2026.
International Preliminary Report on Patentability and Written Opinion dated Sep. 10, 2026 in PCT Application No. PCT/US2025/017302.
International Search Report and Written Opinion dated Jun. 23, 2026 in PCT Application No. PCT/US2026/016949.
JP Decision to Grant and Search Report dated Sep. 1, 2026 in JP Application No. 2024-505516, with English translation.
KR Office Action dated Jun. 30, 2026 in KR Application No. 10-2024-7029132, with English Translation.
TW Office Action and Search Report dated Sep. 9, 2026 in TW Application No. 112103019, with English Translation.
U.S. Final Office Action dated Jul. 31, 2026 in U.S. Appl. No. 18/847,308.
U.S. Non-Final Office Action dated Jul. 10, 2026 in U.S. Appl. No. 18/834,982.
U.S. Non-Final Office Action dated Sep. 4, 2026 in U.S. Appl. No. 18/643,650.
U.S. Notice of Allowance dated Jul. 7, 2026 in U.S. Appl. No. 18/982,327.
U.S. Appl. No. 19/620,091, inventors Martin P.J.E, et al., filed on Aug. 31, 2026.

* cited by examiner

INCREASING PLASMA UNIFORMITY IN A RECEPTACLE

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

Fabrication of integrated circuit devices may involve the processing of semiconductor wafers in a semiconductor processing chamber. Typical processes may involve deposition, in which a semiconductor structure may be built on or over a substrate such as by way of a layer-by-layer process. Typical processes may also involve removal (e.g., etching) of material from certain regions of the semiconductor wafer. In commercial-scale manufacturing processes, each wafer contains many copies of a set of semiconductor devices, and many wafers may be utilized to achieve the required volumes of semiconductor devices. Accordingly, the commercial viability of a semiconductor processing operation may depend upon within-wafer uniformity and upon wafer-to-wafer repeatability of process conditions. Consequently, efforts are made to ensure that each portion of a given wafer, and each wafer processed in a semiconductor processing chamber, is subjected to tightly-controlled processing conditions. Variations in processing conditions can bring about undesirable variations in deposition and etch rates. These variations bring about unacceptable variations in overall fabrication processes. Variations in fabrication processes can degrade circuit performance which, in turn, may give rise to unacceptable variations in performance of higher-level systems that utilize the integrated circuit devices. Hence, techniques for performing semiconductor processes with increased control continues to be an active area of investigation.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Briefly, an implementation may include an apparatus for forming a plasma, which may include a receptacle to accommodate one or more gases, the receptacle being oriented along a first axis. The apparatus can also include an RF coupling structure, substantially oriented in a plane and substantially surrounding the receptacle, the RF coupling structure can be configured to conduct an RF current to bring about formation of the plasma within the receptacle. The apparatus can also include one or more linkages, coupled to the RF coupling structure, to permit the plane of the RF coupling structure to pivot from a neutral position about a second axis so as to tilt the plane of the RF coupling structure toward the first axis.

In some implementations, the one or more linkages of the apparatus can permit the plane of the RF coupling structure to pivot from a neutral position so as to adjust a separation between a portion of the RF coupling structure and the receptacle by between about 0.1 cm and about 3 cm. In some implementations, the apparatus can further include a directionally-adjustable nozzle configured to introduce temperature-regulating gas that, during operation, regulates the temperature of a designated region of an outer surface of the receptacle. In some implementations, the apparatus can be configured such that, during operation when the temperature-regulating gas is flowing into the receptacle, the temperature of the at least the portion of the outer surface of the receptacle is maintained at between about 150° C. and about 400° C. In some embodiments, the directionally-adjustable nozzle is configured to direct the temperature-regulating gas to a designated region on the surface of the receptacle. In some implementations, the designated region is selectable along a first dimension of the receptacle. In some implementations, the designated region is selectable along both first and second dimensions of the receptacle. In some implementations, the first axis is perpendicular to the plane of the RF coupling structure in a neutral position and wherein the second axis is substantially perpendicular to the first axis. In some implementations, the apparatus can further include an RF power generator coupled to the RF coupling structure. In some implementations, the RF coupling structure is configured to form the plasma within the receptacle operating in an inductive mode. In some implementations, the receptacle includes a quartz vessel configured to disperse the plasma into a semiconductor process chamber. In some implementations, the receptacle is configured to accommodate one or more gases at a pressure of between about 0.25 kPa and 1.33 kPa. In some implementations, the RF coupling structure includes one or more conductors configured to form a conductive loop. In some implementations, the one or more linkages of the apparatus include a hinge configured to permit a portion of the conductive loop to tilt toward the receptacle. In some implementations, the apparatus may further include an airflow controller configured to direct airflow from the directionally-adjustable nozzle toward a region on a surface of the receptacle responsive to receipt of a measurement of the temperature of the region of the surface of the receptacle. In some implementations, the airflow controller is additionally configured to modify an airflow volume and an airflow temperature responsive to receipt of the measurement of the temperature of the region of the surface of the receptacle An implementation can include a semiconductor processing tool, which includes one or more input ports configured to receive a corresponding number of output signals from an RF power generator. The semiconductor processing tool also includes one or more process stations, each configured to receive and process a semiconductor wafer. The semiconductor processing tool also includes one or more receptacles configured to receive a gas from a gas source and to convert the received gas to a plasma for dispersing the plasma to the one or more process stations. The semiconductor processing tool also includes one or more coupling structures each substantially oriented in a plane and configured to conduct a current from the RF power generator sufficient to convert the gas to the plasma within the one or more receptacles, the one or more coupling structures each having a linkage to permit rotation of the plane of the one or more coupling structures with respect to an axis that is at least approximately perpendicular to a major axis of the one or more receptacles.

In some implementations, the semiconductor processing tool may include at least 2 process stations. In some implementations, the at least 2 process stations may each include a receptacle of the one or more receptacles and coupling structure of the one or more coupling structures In some implementations, the processing tool may include 4 process stations. In some implementations, the rotation of the plane of the one or more coupling structures is from a neutral position, in which the rotation operates to modify the separation between a portion of the one or more coupling structures and an outer surface of a corresponding receptacle by between about 0.1 cm and about 3 cm. The semiconductor processing tool can further include directionally-adjustable nozzles configured to control recombination of the plasma formed in the one or more receptacles into the gas. In an implementation, the directionally-adjustable nozzles are configured to direct a temperature-regulating gas toward a selectable location on an outer surface of a corresponding one of the one or more receptacles. The semiconductor processing tool can additionally include one or more airflow controllers each configured to receive a signal from one or more temperature sensors configured to measure a temperature at a region of a surface of the one or more receptacles. In an implementation, the one or more airflow controllers of the semiconductor processing tool is configured to direct airflow toward the region of the surface of the one or more receptacles responsive to receipt of the signal from the one or more temperature sensors. In an implementation, the one or more airflow controllers of the semiconductor processing tool is configured to adjust airflow volume or airflow temperature responsive to receipt of the signal from the one or more temperature sensors.

In an implementation, a method of increasing uniformity in plasma formation within a plasma formation receptacle of a semiconductor processing tool includes coupling an RF signal to an RF coupling structure proximate with a chamber of the semiconductor processing tool. The method also includes detecting a nonuniformity in a plasma formed within the plasma formation receptacle in fluid communication with the chamber of the processing tool. The method also includes adjusting a separation distance between a portion of the RF coupling structure and the plasma formation receptacle to reduce the detected nonuniformity in the plasma formed.

In an implementation, adjusting the separation distance between the portion of the RF coupling structure and the plasma formation receptacle includes pivoting the plane of the RF coupling structure about an axis. In an implementation, pivoting the plane of the conductive loop from a neutral position includes reducing a separation between a portion of the plasma formation receptacle and the RF coupling structure by between about 0.5 cm to about 1.5 cm. In an implementation, the method can further include adjusting flow direction and/or volume of a temperature-regulating gas directed toward the plasma formation receptacle to additionally reduce the detected nonuniformity in density of the plasma formed. The method can further include adjusting the flow direction and/or volume of temperature-regulating gas to bring about a temperature of at least a portion of the outer surface of the plasma formation receptacle of between about 150° C. and about 400° C. The method can further include receiving one or more signals from a temperature sensor at or proximate with the plasma formation receptacle and, responsive to the one or more received signals, directing a temperature-regulating gas toward a particular region of a surface of the plasma formation receptacle.

An implementation may include an apparatus configured to form a plasma. The apparatus may include a receptacle configured to receive one or more gases. The apparatus also includes an RF coupling structure configured in the shape of a conductive loop, the RF coupling structure can be configured to receive an RF signal. The apparatus can also include at least one linkage configured to permit a portion of the RF coupling structure to pivot in a direction toward the receptacle.

In some implementations, the at least one linkage of the apparatus can be configured to permit the portion of the RF coupling structure to pivot between 0.1 cm and 3 cm toward the receptacle. The linkage of the apparatus can include a hinge. In some implementations, the apparatus can further include at least one directionally-adjustable nozzle configured to provide an airflow in the direction of the receptacle. The at least one directionally-adjustable nozzle can be configured to provide the airflow so as to maintain a portion of the receptacle at a temperature of between 150° C. and 400° C. The apparatus can further include an airflow controller configured to modify volume or airflow temperature responsive to receipt of an output signal from a temperature sensor at the receptacle.

BRIEF DESCRIPTION OF THE DRAWINGS

The various implementations disclosed herein are illustrated by way of example, and not by way of limitation, in the figures of the accompanying drawings, in which like reference numerals refer to similar elements.

DETAILED DESCRIPTION

Figure 1:
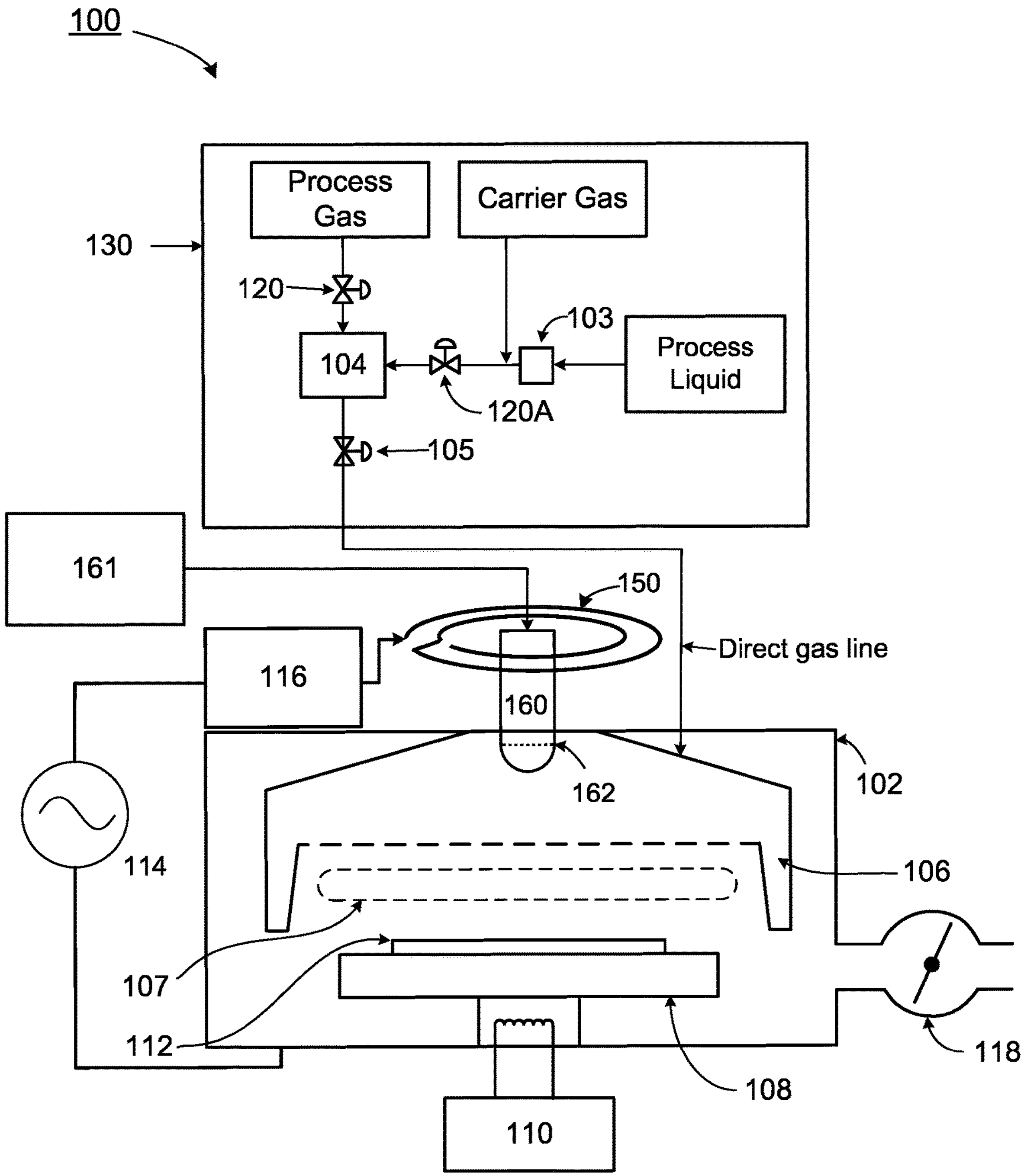
FIG. 1 shows an example apparatus for depositing or etching a film on or over a substrate utilizing any number of processes, according to an implementation.

During wafer fabrication processes, such as deposition of a film on a substrate utilizing a multi-station integrated circuit fabrication chamber, radiofrequency (RF) signals may be coupled into process stations of the chamber. Coupling of RF signals of sufficient energy into a process station may bring about or enhance formation of an ionized plasma material. Atoms of the ionized plasma material may interact with one or more other gases so as to form radicalized specie of precursor gases. When such radicalized specie of precursor gases come into contact with a material present on a surface of a semiconductor substrate undergoing processing, deposition of a thin layer (e.g., a layer having a thickness comparable to that of a single atom or molecule) of a material at the surface of the semiconductor substrate may occur. After exposure of a substrate to an ionized plasma material, the fabrication chamber may be purged and a second gaseous material may be allowed to enter the fabrication chamber to bring about exposure of the semiconductor substrate to the second gaseous material. Following purging of the second gaseous precursor material from the fabrication chamber, ionized plasma materials may again be introduced into the fabrication chamber, which may give rise to formation of an additional thin (e.g., atomic) layer of material. In certain instances, such processes may be repeated over hundreds or thousands of cycles (or an even greater number of cycles) until a film of a desired thickness has been formed or deposited on or over a substrate.

In some instances, an RF coupling structure may include a conductive loop that surrounds a receptacle containing the gaseous material. Gaseous material in a receptacle may be pressurized to a pressure of between about 0.25 kPa and about 1.33 kPa. In response to transfer of sufficient RF energy from the RF coupling structure into the receptacle, the gaseous ionized plasma material may form. The ionized plasma material may then flow, such as by way of a diffuser, from the receptacle and into a process station of the integrated circuit fabrication chamber.

However, formation of an ionized plasma material for use in integrated circuit fabrication chambers utilizing an RF generator may represent a delicate process. In some instances, for example, plasma formation within a receptacle may not occur uniformly in all subvolumes within a plasma formation receptacle. In such instances, an ionized plasma material formed at a first subvolume of the receptacle may be of a greater density than an ionized plasma material formed at a second subvolume of the receptacle. Under these circumstances, even after the ionized plasma material is diffused after exiting the receptacle, nonuniformities in plasma density may persist. These persistent nonuniformities in the density of the ionized plasma material may bring about nonuniform distribution of ionized precursor gases in a fabrication chamber. Nonuniformity of ionized precursor gases in the fabrication chamber may result in unwanted variations in material deposition rates or in rates at which other processes occur across a semiconductor substrate.

In addition, even if plasma can be formed uniformly and without significant variations in plasma density among subvolumes of the receptacle, variations in temperature of the outer surface of the receptacle may introduce variations in plasma density. These additional variations may be brought about via recombination of ionized plasma material within the receptacle. For example, in response to excessive heating of an outer surface of a plasma formation receptacle, ionized hydrogen ($H^+$) that contacts an inner surface of the receptacle return to a nonreactive state, such as diatomic hydrogen ($H_2$). Such recombination of ionized plasma material may result in localized variations in plasma density, which may persist after the ionized plasma material is diffused or dispersed from the plasma formation receptacle. As previously described, nonuniformity of ionized precursor gases in the fabrication chamber may result in unwanted variations in material deposition rates (or in the rates at which other processes occur) across a semiconductor substrate.

Accordingly, integrated circuit fabrication processes, as well as other types of processes, may benefit from increasing uniformity in the density of plasma within subvolumes of a receptacle. One approach toward increasing uniformity in plasma density in a receptacle involves a use of an RF coupling structure, which may be implemented as conductive loop, that may be configured to be repositioned relative to a plasma formation receptacle. In such an arrangement, responsive to detection of changes in plasma density within the plasma formation receptacle, a first portion of the RF coupling structure may be repositioned to become more proximate with the plasma formation receptacle. Such repositioning of the first portion with respect to the receptacle may bring about an increase in the separation of a second portion of the RF coupling structure in relation to the plasma formation receptacle. In particular implementations, repositioning of an RF coupling structure in relation to a plasma formation receptacle may be achieved via a linkage, which refers to a hinge, pivot, swivel, spool, axle, fulcrum, pin, or any combination thereof. An RF coupling structure may be implemented as a conductive loop substantially oriented in a plane. An RF coupling structure may also be implemented as a structure that does not form a conductive loop, such one or more an electrically-small dipoles or other arrangements of conductors, for example. As described further herein, the linkage may permit the plane of the RF coupling structure to tilt or rotate from a neutral position about an axis. Such tilting or rotating may draw the plane of the RF coupling structure toward the major axis of the plasma formation receptacle. In some implementations, such tilting or rotating may operate to reposition a portion of the RF coupling structure which reduces the separation between a portion of the RF coupling structure and the plasma formation receptacle. Separation between a portion of the RF coupling structure and the plasma formation receptacle may be reduced by an amount between about 0.5 cm and about 1.5 cm. In some implementations, the RF coupling structure may tilt or rotate about an axis that is approximately perpendicular (i.e., ±10%) to the major axis of the plasma formation receptacle.

Uniformity in the density of a plasma formed in a receptacle may be further increased through the use of directionally-adjustable nozzles for a temperature-regulating gas. Directionally-adjustable nozzles may be directed with increased accuracy toward a plasma formation receptacle. In an example, 6 directionally-adjustable nozzles, which may be positioned at angular increments around a plasma formation receptacle, may permit control over the flow of the temperature-regulating gas (e.g., filtered air) that contacts the receptacle. Thus, responsive to a detected decrease in plasma density within a plasma formation receptacle, which may result from excessive heating of a portion of the receptacle, flow of a temperature-regulating gas from directionally-adjustable nozzles can be increased. An increase in airflow may reduce the temperature of a portion of the surface of the receptacle, thereby reducing recombination of ionized plasma material into one or more relatively nonreactive gases. In particular implementations, a portion of an outer surface of a plasma formation receptacle may be maintained at a temperature of between about 150° C. and about 400° C. In certain other implementations, a portion of an outer surface of a plasma formation receptacle may be maintained within a different temperature range, such as a range of between about 200° C. and about 350° C.

Certain implementations may be utilized in connection with a number of wafer fabrication processes, such as various plasma-enhanced atomic layer deposition (PEALD)

processes, various plasma-enhanced chemical vapor deposition PECVD) processes, or may be utilized on-the-fly during single deposition processes. In certain implementations, a RF power generator having multiple output ports may be utilized at any signal frequency, such as at frequencies between 300 kHz and 60 MHz, which may include frequencies of 350 kHz, 400 kHz, 440 kHz, 1 MHz, 2 MHz, 13.56 MHz, and 27.12 MHz. However, in other implementations, RF power generators having multiple output ports may operate at any signal frequency, which may include relatively low frequencies, such as between 50 kHz and 300 kHz, as well as higher frequencies, such as frequencies of between about 60 MHz and about 100 MHz.

Particular implementations described herein may show and/or describe multi-station semiconductor fabrication chambers comprising 4 process stations. However, the disclosed implementations are intended to embrace multi-station integrated circuit fabrication chambers that include any number of process stations. Thus, in certain implementations, an output signal of a RF power generator may be divided among, for example, 2 process stations or 3 process stations of a fabrication chamber. An output power signal from a RF power generator may be divided among a larger number of process stations virtually without limitation, such as among 5 process stations, 6 process stations, 8 process stations, 10 process stations, and so forth. Particular implementations described herein may show and/or describe utilization of a single, relatively low frequency RF signal, such as a frequency of between about 300 kHz and about 2 MHz, combined with a single, relatively high-frequency RF signal, such as a frequency of between 2 MHz and 100 MHz. However, the disclosed implementations are intended to embrace the use of any number of radio frequencies, such as frequencies below about 2 MHz as well as radio frequencies above about 2 MHz.

Manufacture of semiconductor devices may involve depositing or etching of one or more thin films on or over a planar or non-planar substrate in connection with an integrated circuit fabrication process. In some aspects of an integrated circuit fabrication process, it may be useful to deposit thin films that conform to unique substrate topography. One type of reaction that is useful in many instances may involve chemical vapor deposition (CVD). In certain CVD processes, gas phase reactants introduced into stations of a reaction chamber simultaneously undergo a gas-phase reaction. The products of the gas-phase reaction deposit on the surface of the substrate. A reaction of this type may be driven by, or enhanced by, presence of a plasma, in which case the process may be referred to as a plasma-enhanced chemical vapor deposition (PECVD) reaction. As used herein, the term CVD is intended to include PECVD unless otherwise indicated.

In another example, as previously alluded to, some deposition processes involve multiple film deposition cycles, in which each deposition cycle produces a discrete film thickness. For example, in atomic layer deposition (ALD), thickness of a deposited layer may be limited by an amount of one or more film precursor reactants, which may adsorb onto a substrate surface, so as to form an adsorption-limited layer, prior to the film-forming chemical reaction itself. Thus, a feature of ALD involves the formation of thin layers of film, such as layers having a width of a single atom or molecule, which are used in a repeating and sequential manner. As device and feature sizes continue to be reduced in scale, and as three-dimensional devices and structures become more prevalent in integrated circuit (IC) design, the capability of depositing thin conformal films (e.g., films of material having a uniform thickness relative to the shape of the underlying structure) continues to gain in importance. Thus, in view of ALD being a film-forming technique in which each deposition cycle operates to deposit a single atomic or molecular layer of material, ALD may be well-suited to the deposition of conformal films. In some instances, device fabrication processes involving ALD may include multiple ALD cycles, which may number into the hundreds or thousands, may then be utilized to form films of virtually any desired thickness. Further, in view of each layer being thin and conformal, a film that results from such a process may conform to a shape of any underlying device structure. In certain implementations, an ALD cycle may include the following steps:

Exposure of the substrate surface to a first precursor.

Purge of the reaction chamber in which the substrate is located.

Activation of a reaction of the substrate surface, such as by exposing the substrate surface with a plasma and/or a second precursor.

Purge of the reaction chamber in which the substrate is located.

The duration of each ALD cycle may, at least in particular implementations, be less than about 25 seconds or less than about 10 seconds or less than about 5 seconds. The plasma exposure step (or steps) of the ALD cycle may be of a short duration, such as a duration of about 1 second or less.

Turning now to the figures, FIG. 1 shows an example apparatus that may be configured or adapted to deposit or etching a film on or over a substrate utilizing any number of processes, according to an implementation. Processing apparatus 100 of FIG. 1 depicts single process station 102 of a process chamber with a single substrate holder 108 (e.g., a pedestal) in an interior volume, which may be maintained under vacuum by vacuum pump 118. Showerhead 106 and gas delivery system 130, which may be in fluid communication with the process chamber, may permit the delivery of film precursors, for example, as well as carrier and/or purge and/or process gases, secondary reactants, ionized plasma materials, etc. Equipment utilized in the generation of plasma within the process chamber is also shown in FIG. 1. The apparatus schematically illustrated in FIG. 1 may be adapted for performing, in particular, plasma-enhanced CVD.

In FIG. 1, gas delivery system 130 includes a mixing vessel 104 for blending and/or conditioning process gases for delivery to showerhead 106. One or more mixing vessel inlet valves 120 may control introduction of process gases to mixing vessel 104. Particular reactants may be stored in liquid form prior to vaporization and subsequent delivery to process station 102 of a process chamber. The implementation of FIG. 1 includes a vaporization point 103 for vaporizing liquid reactant to be supplied to mixing vessel 104. In some implementations, vaporization point 103 may include a heated liquid injection module. In some other implementations, vaporization point 103 may include a heated vaporizer. In yet other implementations, vaporization point 103 may be eliminated from the process station. In some implementations, a liquid flow controller (LFC) upstream of vaporization point 103 may be provided for controlling a mass flow of liquid for vaporization and delivery to process station 102.

Showerhead 106 may operate to distribute process gases and/or reactants (e.g., film precursors) in the direction of substrate 112 at the process station, the flow of which may be controlled by one or more valves upstream from the showerhead (e.g., valves 120, 120A, 105). In the implementation of FIG. 1, substrate 112 is depicted as located beneath showerhead 106, and is shown resting on a pedestal 108. Showerhead 106 may be of any suitable shape, and may include any suitable number and arrangement of ports for distributing process gases to substrate 112. In some implementations involving 2 or more stations, gas delivery system 130 includes valves or other flow control structures upstream from the showerhead, which can independently control the flow of process gases and/or reactants to each station so as to permit gas flow to one station while prohibiting gas flow to a second station. Furthermore, gas delivery system 130 may be configured to independently control process gases and/or reactants delivered to each station in a multi-station apparatus such that the gas composition provided to different stations is different (e.g., the partial pressure of a gas component may vary between stations at the same time).

In FIG. 1, showerhead 106 is depicted as being in fluid communication with plasma formation receptacle 160. Responsive to formation of an ionized plasma material within receptacle 160 utilizing gas from plasma gas source 161, the ionized plasma material may be diffused, such as via diffuser 162, into showerhead 106. Diffuser 162 may comprise an array of through-holes formed in a rounded end portion of receptacle 160. In such implementations, the density of the ionized plasma material formed via plasma formation receptacle 160 can be adjusted (e.g., via a system controller having appropriate machine-readable instructions and/or control logic) by controlling one or more of a gas pressure and/or gas concentration of gases within receptacle 160, output power of RF power generator 114, shunt admittance and/or series reactance of components of matching network 116. Gas volume 107 is depicted as being located beneath showerhead 106. In some implementations, pedestal 108 may be raised or lowered to expose substrate 112 to gas volume 107 and/or to vary the size of gas volume 107. Optionally, pedestal 108 may be lowered and/or raised during portions of the deposition process to modulate process pressure, reactant concentration, etc., within gas volume 107.

RF power generator 114 and matching network 116 may be operated at any suitable RF power level, which may bring about formation of an ionized plasma material having a desired composition of radical gaseous species. In particular implementations, an output port of matching network 116 may be coupled to an RF coupling structure, such as conductive loop 150. In response to coupling of a sufficient current to an input port of conductive loop 150, a time-varying magnetic field (H field) may be created within plasma formation receptacle 160. The time-varying magnetic field operates to strip electrons from one or more orbits of gaseous materials present within plasma formation receptacle 160. The resulting ionized plasma material may be dispersed into showerhead 106 via diffuser 162.

It should be noted that although plasma formation receptacle 160 is shown positioned so that a flattened end of the receptacle intersects the plane of conductive loop 150, in certain other implementations, the plane of conductive loop 150 may be positioned so as to intersect with a different portion of receptacle 160. In an example, the plane of conductive loop 150 may intersect with a portion of receptacle 160 proximate with diffuser 162. It should additionally be noted that, at least in particular implementations, RF power generator 114 may provide RF power having a plurality of frequency components, such as a low-frequency component (e.g., less than about 2 MHz) as well as a high frequency component (e.g., greater than about 2 MHz).

In the implementation of FIG. 1, heater 110 may be placed beneath pedestal 108. Heater 110, which may utilize a resistive heating coil, may bring about heating of pedestal 108 as well as substrate 112. Thus, in certain implementations, showerhead 106 (and/or an alternative plasma formation RF coupling structure) and heater 110 may cooperate to enhance formation of an ionized plasma material which may, consequently, accelerate material deposition and/or material removal (e.g., etching) processes occurring within process station 102.

In some implementations, conditions to bring about the formation and maintenance of an ionized plasma material are controlled via appropriate hardware and/or appropriate machine-readable instructions accessible to a system controller. Machine-readable instructions may include a non-transitory sequence of input/output control (IOC) instructions encoded on a computer-readable media. In one example, the instructions for generating or maintaining an ionized plasma material are provided in the form of a plasma activation recipe of a process recipe. In some cases, process recipes may be sequentially arranged, so that at least some instructions for the process can be executed concurrently. In some implementations, instructions for setting one or more plasma parameters may be included in a recipe preceding a plasma formation process. For example, a first recipe may include instructions for setting a flow rate of an inert (e.g., helium) and/or a reactant gas, instructions for setting an RF power generator to a power set point and time delay instructions for the first recipe. In some deposition processes, a duration of a plasma strike may correspond to a duration of a few seconds, such as from about 3 seconds to about 15 seconds, or may involve longer durations, such as durations of up to about 30 seconds, for example. In certain implementations described herein, much shorter plasma strikes may be applied during a processing cycle.

Figure 2:
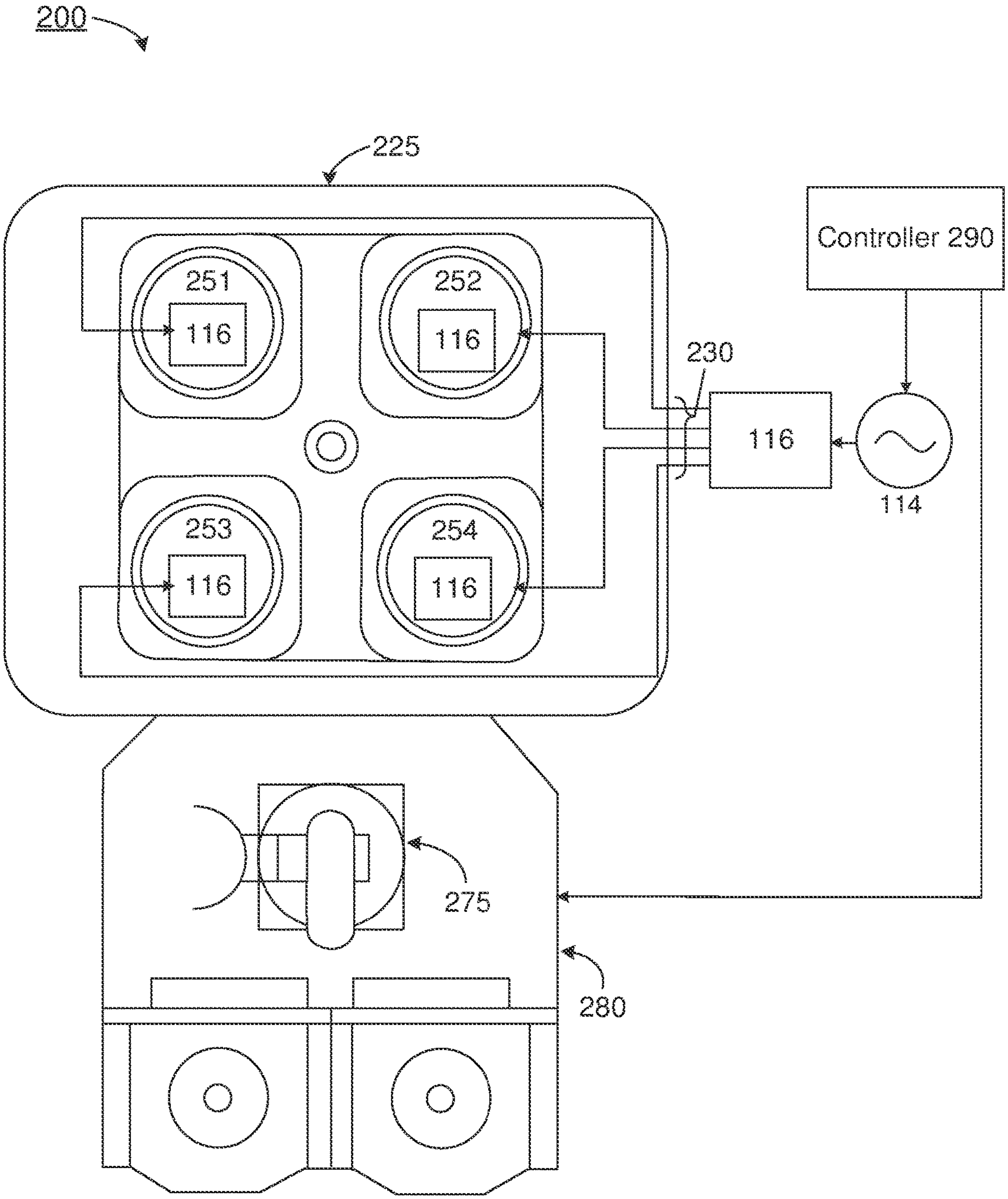
FIG. 2 is a schematic view of a gas delivery system for use with a multi-station integrated circuit fabrication chamber along with equipment utilized to form an ionized plasma material, according to an implementation.

For simplicity, processing apparatus 100 is depicted in FIG. 1 as a standalone station (102) of a process chamber for maintaining a low-pressure environment (e.g., between about 0.25 kPa and about 1.33 kPa). However, it may be appreciated that a plurality of process stations may be included in a multi-station processing tool environment, such as shown in FIG. 2, which depicts a schematic view of an example multi-station processing tool, according to various implementations. Processing tool 200 employs an integrated circuit fabrication chamber 225 that includes multiple process stations. Process stations may be utilized to perform processing operations on a substrate retained via a wafer holder, such as pedestal 108 of FIG. 1, at a particular process station. In the example of FIG. 2, integrated circuit fabrication chamber 225 is shown as including 4 process stations 251, 252, 253, and 254. Other similar multi-station processing apparatuses may include more or fewer process stations depending on the implementation and, for instance, the desired level of parallel wafer processing, size/space constraints, cost constraints, etc. Also shown in FIG. 2 is substrate handler robot 275, which operates under the control of system controller 290, configured or adapted to move substrates from a wafer cassette (not shown in FIG. 2). Substrates from a wafer cassette may be moved from loading port 280 and into multi-station integrated circuit fabrication chamber 225 and onto one of process stations 251, 252, 253, and/or 254.

FIG. 2 also depicts an implementation of a system controller 290 employed to control process conditions and operating states of processing tool 200. System controller 290 may include one or more memory devices, one or more mass storage devices, and one or more processors. The one or more processors may include a central processing unit, analog and/or digital input/output connections, stepper motor controller circuitry, etc. In some implementations, system controller 290 controls all of the activities of process tool 200. System controller 290 executes system control software stored in a mass storage device, which may be loaded into a memory device, and executed by a processor of the system controller. Software to be executed by a processor of system controller 290 may include instructions for controlling the timing, mixture of gases, fabrication chamber and/or station pressure, fabrication chamber and/or station temperature, wafer temperature, substrate pedestal, chuck and/or susceptor position, number of cycles performed on one or more substrates, and other parameters of a particular process performed by process tool 200. These programmed processes may include various types of processes including, but not limited to, processes related to determining an amount of accumulation on a surface of the chamber interior, processes related to the deposition of film on substrates including numbers of ALD cycles, determining and obtaining a number of compensated cycles, and processes related to cleaning the chamber. System control software, which may be executed by one or more processors of system controller 290, may be configured in any suitable way. For example, various process tool component subroutines or control objects may be written to control operation of the process tool components necessary to carry out various tool processes.

In some implementations, software for execution by way of a processor of system controller 290 may include input/output control (IOC) sequencing instructions for controlling the various parameters described above. For example, each phase of deposition and deposition cycling of a substrate may include one or more instructions for execution by system controller 290. The instructions for setting process conditions for an ALD conformal film deposition process phase may be included in a corresponding ALD conformal film deposition recipe phase. In some implementations, the recipe phases may be sequentially arranged, so that all instructions for a process phase are executed concurrently with that process phase.

Other computer software and/or programs stored on a mass storage device of system controller 290 and/or a memory device accessible to system controller 290 may be employed in some implementations. Examples of programs or sections of programs for this purpose can include a substrate positioning program, a process gas control program, a pressure control program, a heater control program, and a plasma control program. A substrate positioning program may include program code for process tool components utilized to load a substrate onto pedestal 108 (of FIG. 1) and to control the spacing between the substrate and other portions of process tool 200. A positioning program can include instructions for appropriately moving substrates into and out of the reaction chamber as necessary to deposit films on substrates, etch substrates, and to clean the chamber.

A process gas control program may include code for controlling gas composition and/or flow rates and for controlling the flow of gas into one or more process stations prior to deposition, which may bring about stabilization of the pressure in the process station. In some implementations, the process gas control program includes instructions for introducing gases during formation of a film on a substrate in the reaction chamber. This may include introducing gases for a different number of cycles for one or more substrates within a batch of substrates. A pressure control program may include code for controlling the pressure in the process station by regulating, for example, a throttle valve in an exhaust system of the process station, a gas flow into the process station, etc. The pressure control program may include instructions for maintaining the same pressure during the deposition of a differing number of cycles on one or more substrates during the processing of the batch.

System controller 290 may additionally control and/or manage the operations of RF power generator 114, which may generate and transmit RF power to multi-station integrated circuit fabrication chamber 225 via RF power input ports 230. Such operations may relate to determining upper and lower thresholds for RF power to be delivered to integrated circuit fabrication chamber 225, RF power activation/deactivation times, RF power on/off duration, duty cycle, operating frequencies, and so forth. Additionally, system controller 290 may determine a set of normal operating parameters of RF power to be delivered to integrated circuit fabrication chamber 225 by way of RF power input ports 230. Such parameters may include upper and lower thresholds of, for example, RF power reflected from integrated circuit fabrication chamber 225 in the direction of matching network 116 in terms of a reflection coefficient (e.g., the scattering parameter $S_{11}$) and/or a voltage standing wave ratio. Such parameters may also include upper and lower thresholds of a voltage applied to RF power input ports 230, upper and lower thresholds of current conducted through RF power input ports 230, as well as an upper threshold for a magnitude of a phase angle between a voltage and a current conducted through RF power input ports 230. Such thresholds may be utilized in defining "out-of-range" RF signal characteristics. For example, reflected power greater than an upper threshold may indicate an out-of-range RF power parameter. Likewise, an applied voltage or conducted current having a value below a lower threshold or greater than an upper threshold may indicate out-of-range RF signal characteristics.

In certain implementations, RF power generator 114 may operate to generate two frequencies, such as a first frequency of about 400 kHz and a second frequency of about 13.56 MHz. It should be noted, however, that RF power generator 114 may be capable of generating additional frequencies, such as frequencies of between about 300 kHz and about 100 MHz, and implementations are not limited in this respect. In particular implementations, signals generated by RF power generator 114 may include at least one low frequency (LF), which may be defined as a frequency of between about 300 kHz and about 2 MHz RF power generator 114 may additionally generate at least one high frequency (HF), which may be defined as a frequency greater than about 2 MHz but less than about 100 MHz.

In some implementations, there may be a user interface associated with system controller 290. The user interface may include a display screen, graphical software displays of the processing tool and/or process conditions, and user input devices such as pointing devices, keyboards, touch screens, microphones, etc.

In some implementations, parameters adjusted by system controller 290 may relate to process conditions. Non-limiting examples may include process gas composition and flow rates, temperature, pressure, plasma conditions, etc. These parameters may be provided to the user in the form of a recipe, which may be entered utilizing the user interface. The recipe for an entire batch of substrates may include compensated cycle counts for one or more substrates within the batch in order to account for thickness trending over the course of processing the batch.

Signals for monitoring a fabrication process may be provided by analog and/or digital input connections of system controller 290 from various process tool sensors. Signals for controlling the process may be transmitted by way of the analog and/or digital output connections of process tool 200. Non-limiting examples of process tool sensors that may be monitored include mass flow controllers, pressure sensors (such as manometers), thermocouples, etc. Sensors may also be included and used to monitor and determine the accumulation on one or more surfaces of the interior of the chamber and/or the thickness of a material layer on a substrate in the chamber. Appropriately programmed feedback and control algorithms may be used with data from these sensors to maintain process conditions.

System controller 290 may provide program instructions for implementing the above-described deposition processes. The program instructions may control a variety of process parameters, such as DC power level, pressure, temperature, number of cycles for a substrate, amount of accumulation on at least one surface of the chamber interior, etc. The instructions may control the parameters to operate in-situ deposition of film stacks according to in implementation described herein.

For example, system controller 290 may include control logic for performing the techniques described herein, such as determining (a) an amount of accumulated deposition material currently on at least an interior portion of the deposition chamber interior. In addition, system controller 290 may include control logic for applying the amount of accumulated deposition material determined in (a), or a parameter derived therefrom, to a relationship between (i) a number of ALD cycles required to achieve a target deposition thickness, and (ii) a variable representing an amount of accumulated deposition material, in order to obtain a compensated number of ALD cycles for producing the target deposition thickness given the amount of accumulated deposition material currently on the interior portion of the deposition chamber. System controller 290 may include control logic for performing number of ALD cycles on one or more substrates in the batch of substrates. System controller 290 may also include control logic for determining that the accumulation in the chamber has reached an accumulation limit and stopping the processing of the batch of substrates in response to that determination, and for initiating a cleaning operation of the chamber interior.

Figure 3:
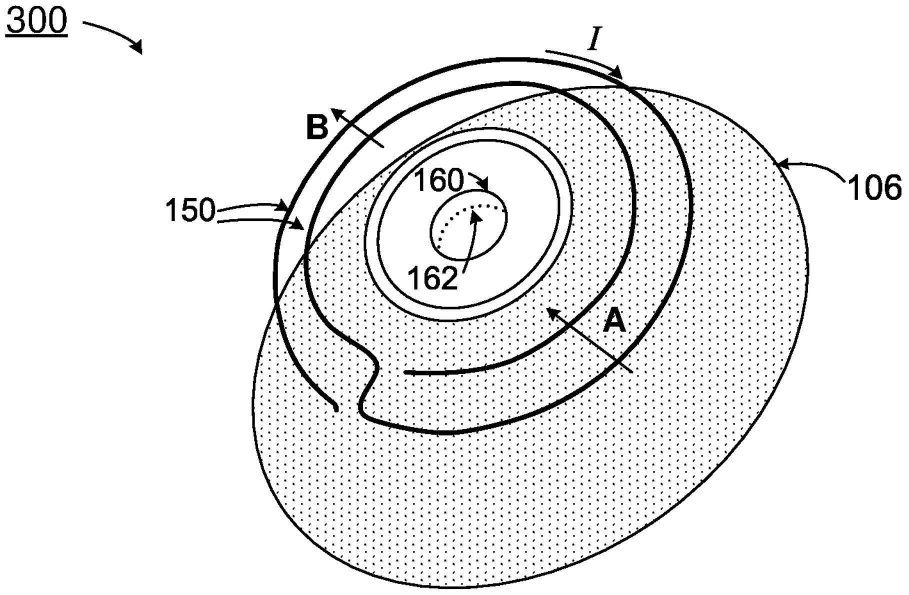
FIG. 3 is a perspective view showing some of the components involved in the formation of an ionized plasma material, according to an implementation.

As previously discussed in relation to FIG. 1, an RF coupling structure, such as conductive loop 150, may be utilized to form an ionized plasma material within receptacle 160. The ionized plasma material may be diffused into an appropriate mixing device, such as showerhead 106 of a process station. Accordingly, FIG. 3 is a perspective view showing some of the components involved in the formation of an ionized plasma material, according to an implementation 300. In FIG. 3, a portion of receptacle 160 is shown as nested or disposed within a central portion of showerhead 106. Ionized plasma material may flow from receptacle 160 into showerhead 106 via diffuser 162. Conductive loop 150 may be formed from a metallic conductor (e.g., copper) and may be capable of conducting an electric current of, for example, between 25 A and 150 A. Conductive loop 150 may be configured in a circle or an ellipse so as to surround (or to at least substantially surround) receptacle 160. As previously described, such as in relation to FIG. 1, the plane of conductive loop 150 may intersect with receptacle 160 perhaps at a location proximate with diffuser 162.

In response to an RF current (I) having a sufficient magnitude generates a magnetic (or H) field proximate to the conductive loop. In response to formation of the magnetic field, at least a portion of the gas within plasma formation receptacle 160 is converted to an ionized plasma material. However, such conversion to an ionized plasma material within receptacle 160 may not be entirely uniform at all subvolumes within receptacle 160. Accordingly, as discussed further herein, the plane of conductive loop 150 may be tilted or rotated from a neutral position so that a first portion of conductive loop 150 (e.g., portion A in FIG. 3) is moved toward receptacle 160. Tilting or rotation of conductive loop 150 may additionally move a second portion of conductive loop 150 (e.g., portion B in FIG. 3) away from receptacle 160.

Figure 4A:
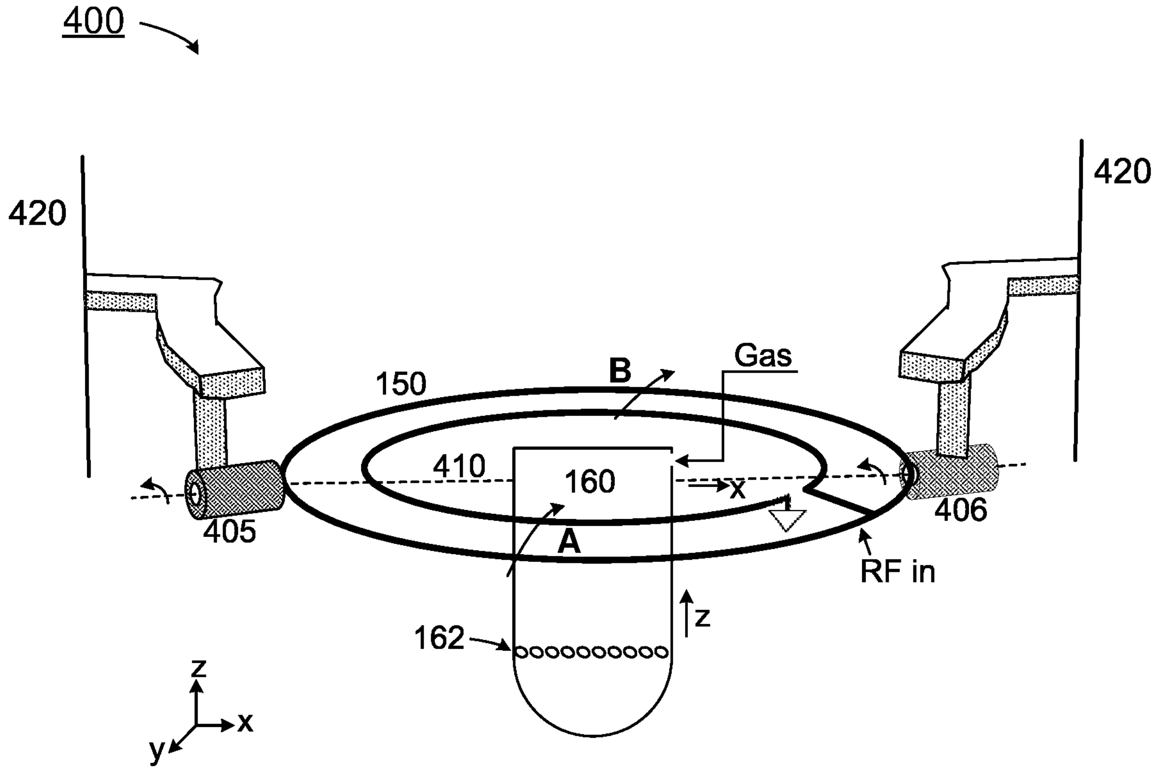
FIG. 4A shows a conductive loop and linkage for increasing plasma distribution uniformity in a fabrication chamber, according to an implementation.

FIG. 4A illustrates an implementation 400 that includes a conductive loop and linkage for increasing plasma distribution uniformity in a fabrication chamber, according to an implementation 400. As shown in FIG. 4A, in a neutral position, conductive loop 150 is oriented substantially in the XY plane. Linkages 405 and 406 may permit rotation tilting of the plane of conductive loop 150 about axis 410 by an amount of between 1° and 10°. As shown in FIG. 4A, as the plane of conductive loop 150 is rotated or tilted about axis 410, a first portion A may be drawn toward receptacle 160. As portion A is drawn toward receptacle 160, portion B may be drawn away from receptacle 160. As a consequence of such tilting or rotation of the plane of conductive loop 150, plasma formed within certain subvolumes of receptacle 160, such as those subvolumes located near portion A of conductive loop 150, may increase in density. In addition, plasma formed within certain other subvolumes of receptacle 160, such as those subvolumes near portion B of conductive loop 150, may decrease in density.

Although shown as having a cylinder-like shape, linkages 405 and 406 that permit rotation or tilting of the plane of conductive loop 150 may correspond to any type of structure. Suitable structures that permit rotation or tilting of the plane of conductive loop 150 can include a hinge, pivot, swivel, spool, axle, fulcrum, pin, or any combination thereof. Linkages 405 and 406 may be secured to fabrication chamber wall 420 via a bracket or other structure that provides mechanical support to the linkages. In an implementation, although not shown in FIG. 4A, the precise angular displacement of the plane of conductive loop 150 may result from manual adjustment of linkages 405 and 406. In another implementation, angular displacement of the plane of conductive loop 150 may result from use of the stepper motor, which may be controlled by system controller 290 of FIG. 2). In particular implementations, rotation of the plane of conductive loop 150 from a neutral position may result in portion A of the conductive loop being drawn toward receptacle 160 by a distance of between about 0.5 cm and about 1.5 cm. In turn, portion B of conductive loop 150 may be drawn away from receptacle 160 by between about 0.5 cm and about 1.5 cm. However, in other implementations, linkages 405 and 406 may permit portion A to be drawn toward plasma formation receptacle 160 by different amounts, such as between 0.1 cm and 3 cm, while portion B is drawn away from receptacle 160 by a corresponding amount.

It should be noted that although the plane of conductive loop 150 intersects plasma formation receptacle 160 at a flattened end portion of the receptacle, in other implementations, receptacle 160 may be repositioned to any location along the z-axis. In one example, receptacle 160 may be repositioned along the +z-axis such that the plane of conductive loop 150 intersects receptacle 160 at a location that at least approximately corresponds to the location of diffuser 162. Further, although FIG. 4A depicts rotation of the plane of conductive loop 150 via linkages 405 and 406 as permitting to relative movement of portions A and B of the conductive loop with respect to receptacle 160, other implementations may employ alternative approaches to permit movement of one or more portions of the conductive loop with respect to receptacle 160.

Figure 4B:
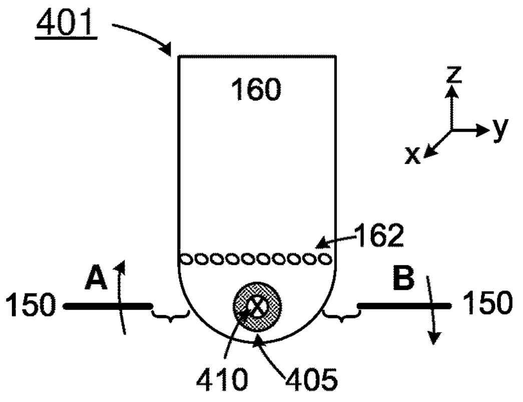
FIGS. 4B and 4C show tilting of the plane of a conductive loop from a neutral position via a linkage, according to an implementation.
Figure 4C:
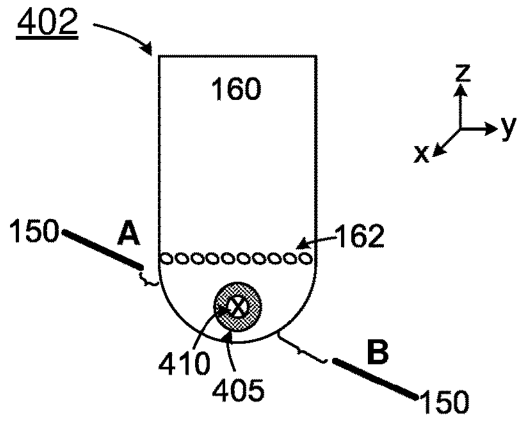

FIGS. 4B and 4C show tilting of the plane of a conductive loop via linkage 405, according to an implementation 401. In the implementation of FIG. 4B, the plane of conductive loop 150 is shown in a neutral position and being substantially oriented in the XY plane. In some implementations, the XY plane is at least approximately perpendicular to the major axis (e.g., the Z-axis) of plasma formation receptacle 160. In addition, the plane of conductive loop 150 is shown as intersecting plasma formation receptacle 160 at a location between diffuser 162 and an end portion of receptacle 160. Linkage 405 permits rotation about an axis 410, which extends into and out of the page. In FIG. 4B, portions A and B of conductive loop 150 are depicted as being approximately equidistant from receptacle 160.

In FIG. 4C (implementation 402), the plane of conductive loop 150 is depicted as being rotated or tilted in a clockwise direction about axis 410. Clockwise rotation about axis 410 decreases separation between portion A of conductive loop 150 and plasma formation receptacle 160. Clockwise rotation of conductive loop 150 from a neutral position may draw the plane of the conductive loop toward the z-axis, along which the major axis of plasma formation receptacle 160 is oriented. Clockwise rotation of the plane of conductive loop 150 also brings about an increase in the separation between portion B of conductive loop 150 and plasma formation receptacle 160. In the implementation of FIG. 4C, rotation of the plane of conductive loop 150 decreases the separation between portion A and receptacle 160 by an amount of as much as about 1.5 cm. Rotation of the plane of conductive loop 150 may increase the separation between portion B and receptacle 160 by as much as about 1.5 cm. However, in certain other implementations, rotation of the plane of conductive loop 150 may decrease the separation between a first portion of the conductive loop and the receptacle by other amounts, such as by up to about 1.75 cm, 2.0 cm, 2.25 cm, 2.5 cm, or other desired amount. Rotation of the plane of conductive loop 150 may increase the separation between a second portion of the conductive loop and the receptacle by similar amounts.

As previously mentioned, in particular implementations, rotating or tilting the plane of a conductive loop from a neutral position operates to draw a first portion of the conductive loop toward a receptacle. Drawing of a first portion of the conductive loop toward the receptacle also moves a second portion of the conductive loop away from the receptacle. Such increases and decreases in separation between the conductive loop and the receptacle can bring about an increase in the uniformity in the density of a plasma formed within the receptacle. Also as previously mentioned, in certain implementations, exercising control over the temperature of a surface of the plasma formation receptacle can additionally increase uniformity of plasma density. Such additional increases in uniformity of plasma density occur by reducing recombination of ionized plasma material. To this end, FIG. 5A shows directionally-adjustable nozzles for providing a temperature-regulating gas to reduce recombination of ionized plasma material within a receptacle, according to an implementation 500.

Figure 5A:
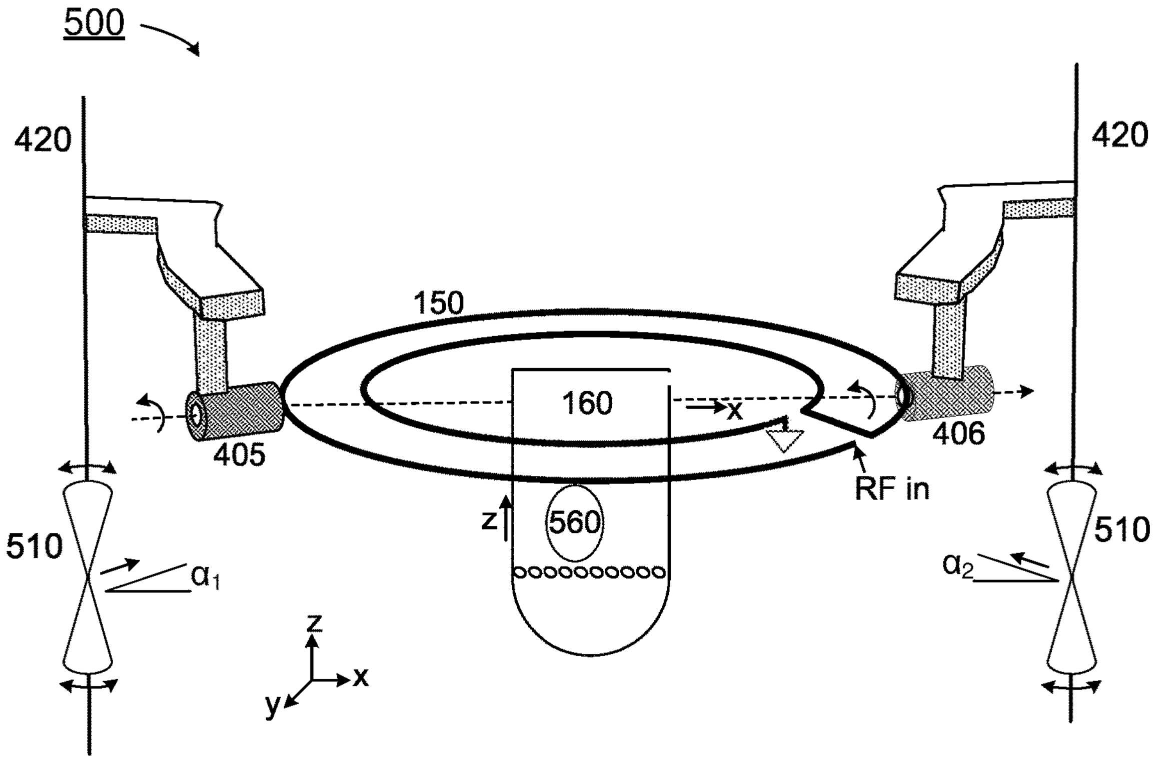
FIG. 5A is a side view showing directionally-adjustable nozzles for directing a temperature-regulating gas to reduce recombination of ionized plasma material within a receptacle, according to an implementation.

In FIG. 5A, directionally-adjustable nozzles 510 are shown as being disposed within fabrication chamber wall 420. In particular implementations, directionally-adjustable nozzles 510 may be adjusted to permit a temperature-regulating gas, such as filtered air, to be directed toward regions of a surface of plasma formation receptacle 160. In certain implementations, angular orientation of directionally-adjustable nozzles 510 may be adjustable so as to direct flow of a temperature-regulating gas at angles of between 0° and $\alpha_1$ or $\alpha_2$. In response to detection of a nonuniformity in plasma formation, which may result from recombination of ionized plasma materials, directionally-adjustable nozzles 510 may be directed toward plasma formation receptacle 160. In response to temperature control of regions of the outer surface of plasma formation receptacle 160, uniformity in plasma density can be increased via reduction in recombination of ionized plasma material.

For example, as shown in FIG. 5A, one or more of directionally-adjustable nozzles 510 is capable of directing a temperature-regulating gas in the direction of region 560 of plasma formation receptacle 160. Region 560 may be moved in the z direction (e.g., the vertical direction in FIG. 5A) in response to adjustment of angle $\alpha_1$, which may be controlled by a stepper motor or any other type of motorized controller. Region 560 may also be moved in the x direction (e.g., the horizontal direction in FIG. 5A) under the control of a stepper motor or other motorized control device. In addition to controlling the location of region 560 via exercising directional control over directionally-adjustable nozzles 510, nozzles 510 may additionally regulate volume and temperature of a gaseous mixture, such as filtered air. Accordingly, in certain implementations, via control over the azimuth and elevation angles of directionally-adjustable nozzles 510 as well as flow volume and temperature of a temperature-regulating gas, nozzles 510 may precisely control the temperature of particular regions of the surface of a plasma formation receptacle.

In particular implementations, precise control over the surface temperature of one or more regions of plasma formation receptacle 160 may permit greater control over processes related to material deposition on a semiconductor wafer. For example, in particular implementations, material deposition at an edge portion of a semiconductor wafer undergoing processing may be enhanced by locating region 560 at a bottom portion of receptacle 160. Conversely, material deposition at an edge portion of a semiconductor wafer undergoing processing may be reduced by locating region 560 away from diffuser 162 (e.g., proximate to the flat end of plasma formation receptacle 160). Thus, in some implementations, a wafer deposition profile can be tailored in which edge or circumferential portions of a semiconductor wafer are formed thicker than a central portion of the semiconductor wafer. Differences in thickness can be controlled via precise control over the temperature distribution of the outer surface of a plasma formation receptacle.

It should be noted that although FIG. 5A indicates only two directionally-adjustable nozzles, in other implementations, a different number of directionally-adjustable nozzles may be utilized, such as 3 directionally-adjustable nozzles, 4 directionally-adjustable nozzles, 5 directionally-adjustable nozzles, 6 directionally-adjustable nozzles, or any other number of directionally-adjustable nozzles. Additionally, although directionally-adjustable nozzles 510 are configured to move or articulate so as to focus temperature-reducing gas along the z-axis of plasma formation receptacle 160, in other implementations, directionally-adjustable nozzles 510 may be capable of movement in other directions, such as along the y-axis. Further, directionally-adjustable nozzles 510 may incorporate a variable-speed motor or other type of impeller, which may operate to adjust the rate of flow of the temperature-regulating gas.

Figure 5B:
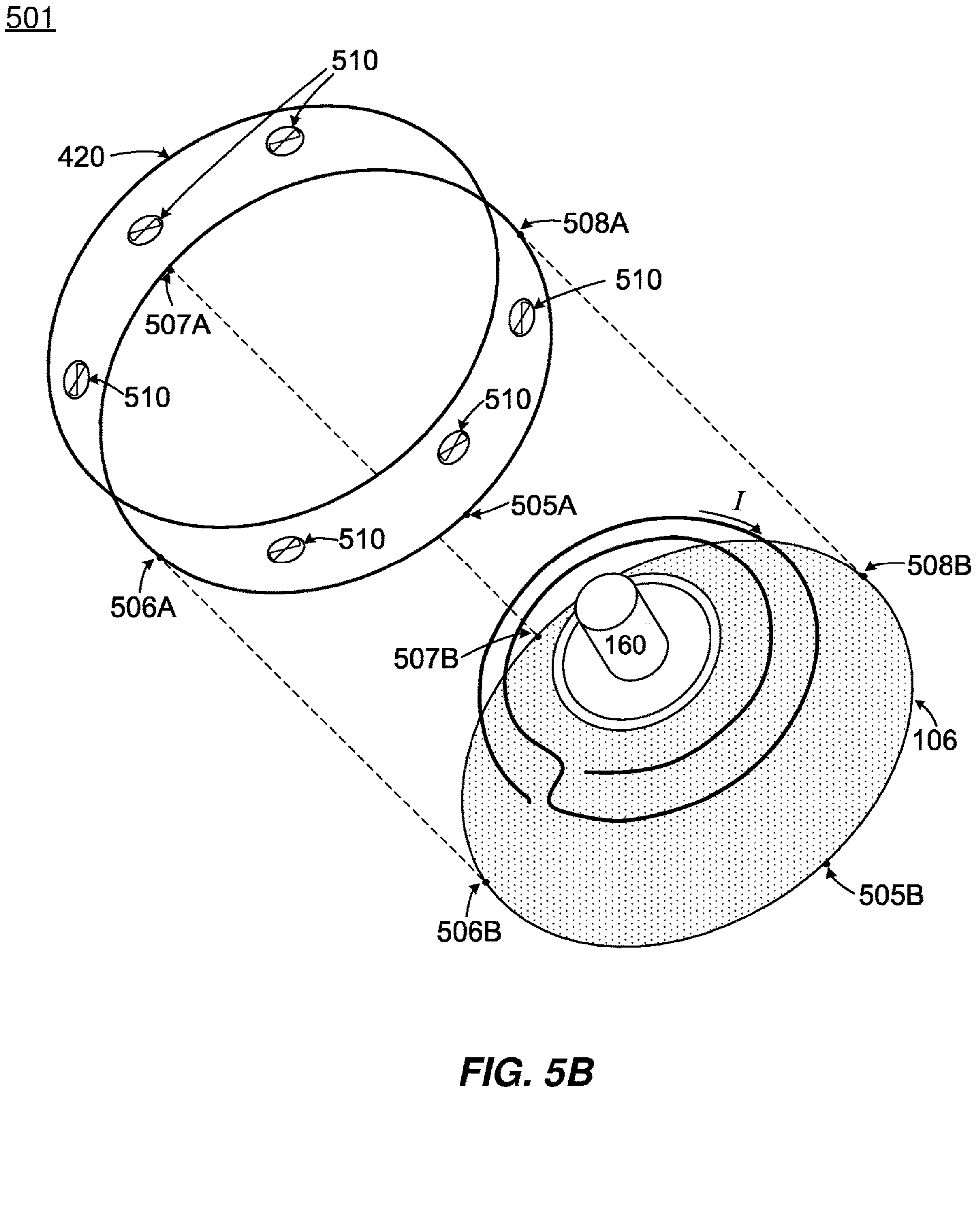
FIG. 5B is a perspective view showing directionally-adjustable nozzles for directing a temperature-regulating gas to reduce recombination of ionized plasma material within a receptacle, according to an implementation.

FIG. 5B is a perspective view showing directionally-adjustable nozzles for directing a temperature-regulating gas to reduce recombination of ionized plasma material within a receptacle, according to an implementation 501. As shown in FIG. 5B, chamber wall 420 can be secured to showerhead 106. Thus, as shown, location 505A of chamber wall 420 mates or connects with location 505B of showerhead 106. Similarly, location 506A of chamber wall 420 mates or connects with location 506B of showerhead 106. Similarly, location 507A of chamber wall 420 mates or connects with location 507B of showerhead 106. Similarly, location 508A of chamber wall 420 mates or connects with location 508B of showerhead 106. Responsive to connection of chamber wall 420 with showerhead 106, directionally-adjustable nozzles 510 may provide flow of a temperature-regulating gas to virtually any region along the outer surface of plasma formation receptacle 160. Accordingly, as previously mentioned with respect to FIG. 5A, via azimuthal and elevational control of directionally-adjustable nozzles 510, virtually any portion of the outer surface of plasma formation receptacle 160 can come into contact with a flow of temperature-regulating gas. Additionally, by way of exercising control over the volume and temperature of the temperature-regulating gas, a temperature profile of the outer surface of plasma formation receptacle 160 can be precisely tuned.

It may be appreciated that nonuniformities in plasma formation may be reduced or virtually eliminated by way of precise control over separation between elements of a conductive loop. It may also be appreciated that precise control over the temperature of the outer surface of the plasma formation receptacle we also reduce nonuniformities in plasma formation. Accordingly, in particular implementations, in response to an inability to reduce nonuniformity in plasma density to below a desired threshold, directionally-adjustable nozzles 510 may provide an additional approach toward reducing nonuniformity in plasma density.

Figure 5C:
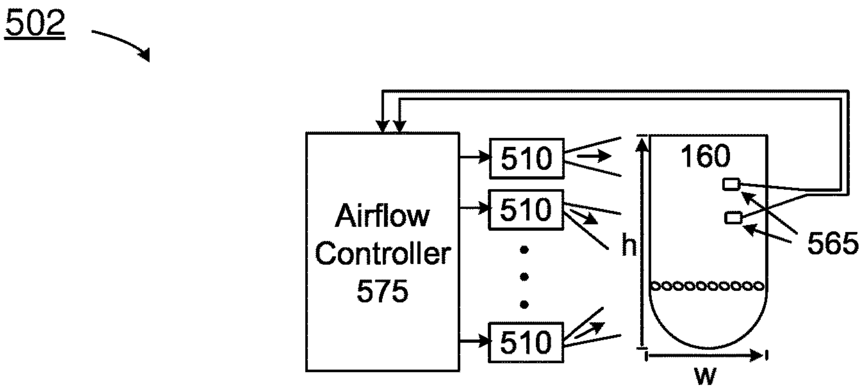
FIG. 5C is a block diagram showing an airflow controller, according to an implementation 502.

FIG. 5C is a block diagram showing an airflow controller, according to an implementation 502. The airflow controller of implementation 502 may be controlled, at least in part, via temperature feedback from sensors proximate with a plasma formation receptacle. As shown in FIG. 5C, one or more temperature sensors 565 may be affixed, for example, to a region of an outer surface of plasma formation receptacle 160. In certain implementations, temperature sensors 565 may correspond to resistance temperature detectors (RTDs). In an RTD, resistance of a sensing element is modified responsive to a change in the temperature of the sensing element. In particular implementations, temperature sensors 565 may correspond to a thermocouple. In a thermocouple, exposure of a thermal sensor to a heat source brings about conduction of an electric current between a "hot" junction and a "cold" junction. Temperature sensors 565 may employ other approaches toward providing a signal that can be related to the temperature of a portion of an outer surface of plasma formation receptacle 160, such as infrared sensing.

Signals from temperature sensors 565 may be received at airflow controller 575, which may utilize a processor coupled to a memory and may operate to exercise control over directionally-adjustable nozzles 510. Although only three directionally-adjustable nozzles 510 are shown in FIG. 5C, any number of nozzles may be utilized, such as 3 nozzles, 4 nozzles, 5 nozzles, 6 nozzles, 8 nozzles, 10 nozzles, 12 nozzles, or any other number of nozzles, such as 15 or 20 nozzles, for example. Additionally, airflow controller 575 may increase the volume of a temperature-regulating gas (e.g., filtered air) provided by each of directionally-adjustable nozzles 510. Airflow controller 575 may utilize a temperature-control element to adjust the temperature of the temperature-regulating gas directed toward plasma formation receptacle 160. Thus, a quantity (e.g., volumetric flow) of a temperature-regulating gas, at a predefined temperature, may be directed toward substantially any region on the surface of plasma formation receptacle 160. As discussed in relation to FIGS. 5A and 5B, precise control over the temperature, quantity, and positioning of a temperature-regulating gas may result in a tailored temperature profile of the outer surface of plasma formation receptacle 160. A tailored temperature profile of the outer surface of a plasma formation receptacle can result in an ability to tailor a deposition profile of a semiconductor wafer undergoing processing utilizing plasma from receptacle 160.

It should be noted that a plasma formation receptacle may be a vessel having, for example, a shape of a bell jar. In some embodiments, the plasma formation receptacle may be substantially made of quartz. In some embodiments, the plasma formation receptacle may be substantially made of a ceramic material, such as Aluminum Oxide ($Al_2O_3$). It may be appreciated that various materials that may be used in the plasma formation receptacle may have various benefits. For example, a plasma formation receptacle substantially made of quartz may be highly resistant to thermal stress. As another example, a plasma formation receptacle substantially made of Aluminum Oxide may be resistant to corrosion.

A plasma formation receptacle substantially made of Aluminum Oxide may be more susceptible to thermal stress (e.g., cracking) than a plasma formation receptacle substantially made of quartz. Directionally-adjustable nozzles (e.g., directionally-adjustable nozzles 510 as shown in FIGS. 5A, 5B, and 5C) may be used to direct temperature-regulating gas (e.g., at a predefined temperature) toward particular regions of a plasma formation receptacle made substantially of Aluminum Oxide, for example, as described above in connection with FIG. 5C. By generating a tailored temperature profile of an outer surface of the plasma formation receptacle (e.g., as described above in connection with FIG. 5C), the plasma formation receptacle may be prevented from cracking due to thermal stress. In some embodiments, use of directionally-adjustable nozzles to direct temperature-regulating gas toward particular regions of a plasma formation receptacle substantially made of Aluminum Oxide may allow higher RF powers to be used (e.g., at least about 3 KW) relative to an instance in which directionally-adjustable nozzles are not used.

Figure 6:
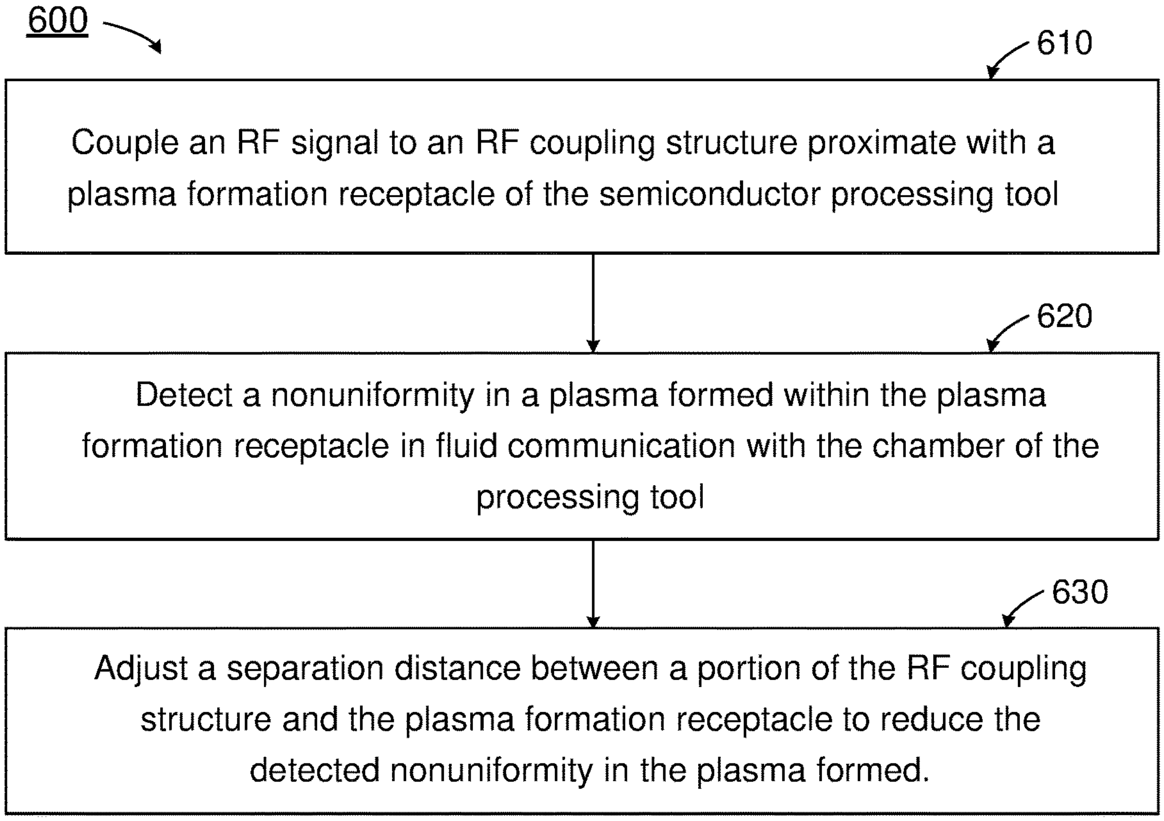
FIG. 6 shows a flowchart for a method increasing uniformity in plasma formation within a plasma formation receptacle of a semiconductor processing tool, according to an implementation.

FIG. 6 shows a flowchart for a method of increasing uniformity in plasma formation within a plasma formation receptacle of a semiconductor processing tool according to an implementation 600. Although the method of FIG. 6 indicates a particular sequence of operations, other implementations may include operations above and beyond those identified in FIG. 6 and/or may include operations performed in a different order than identified in FIG. 6. The method of FIG. 6 may begin at 610, which includes coupling an RF signal to an RF coupling structure proximate with a plasma formation receptacle of the semiconductor processing tool. The RF coupling structure utilized at 610 may include a vessel, such as a bell jar, heated to a temperature of between 150° C. and about 400° C. In some embodiments, the vessel may be substantially made of quartz. In some embodiments, the vessel may be substantially made of a ceramic material, such as Aluminum Oxide. The vessel may be heated by way of an RF signal from the RF coupling structure. The coupling structure utilized in 610 may include a conductive loop having a plane substantially oriented in a direction that intersects the plasma formation receptacle along the length of the receptacle. The method may continue at 620, in which a nonuniformity in the plasma formed within the plasma formation receptacle is detected. The plasma formation receptacle may be in fluid communication with one or more fabrication chambers of the processing tool. At 630, a separation distance between a portion of the RF coupling structure and the plasma formation receptacle may be adjusted. Adjustment of the separation distance may operate to reduce nonuniformity in the plasma formed within the receptacle. In particular implementations, 630 may include rotating or tilting the plane of a conductive loop so as to reduce the separation between a first portion of the conductive loop and the plasma formation receptacle while increasing the separation between a second portion of the conductive loop and the plasma formation receptacle.

Returning now to FIG. 2, in general, controller 290 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers or field-programmable gate arrays (FPGA) or FPGA with system-on-a-chip (SoC) that that execute program instructions (e.g., software). Program instructions may be instructions communicated to the controller in the form of various individual settings (or program files), defining operational parameters for carrying out a particular process on or for a semiconductor wafer or to a system. The operational parameters may, in some implementations, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus, as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

In the foregoing detailed description, numerous specific details are set forth to provide a thorough understanding of the presented implementations or implementations. The disclosed implementations or implementations may be practiced without some or all of these specific details. In other instances, well-known process operations have not been described in detail so as to not unnecessarily obscure the disclosed implementations or implementations. While the disclosed implementations or implementations are described in conjunction with the specific implementations or implementations, it will be understood that such description is not intended to limit the disclosed implementations or implementations.

The foregoing detailed description is directed to certain implementations or implementations for the purposes of describing the disclosed aspects. However, the teachings herein can be applied and implemented in a multitude of different ways. In the foregoing detailed description, references are made to the accompanying drawings. Although the disclosed implementations or implementation are described in sufficient detail to enable one skilled in the art to practice the implementations or implementation, it is to be understood that these examples are not limiting; other implementations or implementation may be used and changes may be made to the disclosed implementations or implementation without departing from their spirit and scope. Additionally, it should be understood that the conjunction "or" is intended herein in the inclusive sense where appropriate unless otherwise indicated; for example, the phrase "A, B, or C" is intended to include the possibilities of "A," "B," "C," "A and B," "B and C," "A and C," and "A, B, and C."

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry may include a diameter of 200 mm, or 300 mm, or 450 mm. The foregoing detailed description assumes implementations or implementations are implemented on a wafer, or in connection with processes associated with forming or fabricating a wafer. However, disclosed implementations are not limited to such implementations. The work piece may be of various shapes, sizes, and materials. In addition to semiconductor wafers, other work pieces that may take advantage of claimed subject matter and may include various articles such as printed circuit boards, or the fabrication of printed circuit boards, and the like.

Unless the context of this disclosure clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also generally include the plural or singular number respectively. When the word "or" is used in reference to a list of 2 or more items, that word covers all of the following interpretations of the word: any of the items in the list, all of the items in the list, and any combination of the items in the list. The term "implementation" refers to implementations of techniques and methods described herein, as well as to physical objects that embody the structures and/or incorporate the techniques and/or methods described herein.

What is claimed is:

1. An apparatus for forming a plasma, comprising:

a receptacle configured to accommodate one or more gases, the receptacle being oriented along a first axis;

a showerhead, coupled to the receptacle via a diffuser, the showerhead configured to receive the plasma from the receptacle via the diffuser, the first axis corresponding to a direction of plasma flow through the diffuser into the showerhead;

a radiofrequency (RF) coupling structure, substantially oriented in a plane and substantially surrounding the receptacle, the RF coupling structure configured to conduct an RF current to bring about formation of the plasma within the receptacle; and two or more linkages, coupled to the RF coupling structure, the two or more linkages including a first linkage situated at a first position of the RF coupling structure and a second linkage situated at a second position on an opposite side of the RF coupling structure with respect to the first position to define a second axis through a center of the RF coupling structure between the first and second linkages to permit the plane of the RF coupling structure to pivot about the second axis and tilt structure toward the first axis to control a uniformity of the plasma formed within the receptacle.

2. The apparatus of claim 1, wherein the two or more linkages are configured to permit the plane of the RF coupling structure to pivot from a neutral position so as to adjust a separation between a portion of the RF coupling structure and the receptacle by between about 0.1 cm and about 3 cm.

3. The apparatus of claim 1, further comprising a directionally-adjustable nozzle configured to introduce temperature-regulating gas that, during operation, regulates a temperature of at least a portion of an outer surface of the receptacle.

4. The apparatus of claim 3, wherein the apparatus is configured such that, during operation when the temperature-regulating gas is flowing into the receptacle, the temperature of the at least the portion of the outer surface of the receptacle is maintained at between about 150° C. and 400° C.

5. The apparatus of claim 3, wherein the directionally-adjustable nozzle is configured to direct the temperature-regulating gas to a designated region on the outer surface of the receptacle.

6. The apparatus of claim 5, wherein the designated region is selectable along a first dimension of the receptacle.

7. The apparatus of claim 6, wherein the designated region is selectable along both first and second dimensions of the receptacle.

8. The apparatus of claim 1, wherein the first axis is perpendicular to the plane of the RF coupling structure, disposed in a neutral position, and wherein the second axis is substantially perpendicular to the first axis.

9. The apparatus of claim 1, further comprising an RF power generator coupled to the RF coupling structure.

10. The apparatus of claim 1, wherein the RF coupling structure is configured to form the plasma within the receptacle operating in an inductive mode.

11. The apparatus of claim 1, wherein the receptacle comprises a quartz vessel configured to disperse the plasma into a semiconductor process chamber.

12. The apparatus of claim 1, wherein the receptacle comprises an Aluminum Oxide vessel configured to disperse the plasma into a semiconductor process chamber.

13. The apparatus of claim 1, wherein the receptacle is configured to accommodate one or more gases at a pressure of between about 0.25 kPa and 1.33 kPa.

14. The apparatus of claim 1, wherein the RF coupling structure comprises a conductor configured to form a conductive loop.

15. The apparatus of claim 14, wherein at least one of the two or more linkages comprises a hinge configured to permit a portion of the conductive loop to tilt toward the receptacle.

16. The apparatus of claim 1, further comprising an airflow controller configured to direct airflow from a directionally-adjustable nozzle toward a region on a surface of the receptacle responsive to receipt of a measurement of a temperature of the region of the surface of the receptacle.

17. The apparatus of claim 16, wherein the airflow controller is additionally configured to modify an airflow volume and an airflow temperature responsive to receipt of the measurement of the temperature of the region of the surface of the receptacle.

18. An apparatus configured to form a plasma, comprising:

a receptacle configured to receive one or more gases, the receptacle being oriented along a first axis;

a showerhead, coupled to the receptacle, the showerhead configured to receive the plasma from the receptacle, the first axis corresponding to a direction of plasma flow from the receptacle into the showerhead;

an RF coupling structure, the RF coupling structure configured to receive an RF signal, the RF coupling structure configured to conduct an RF current to bring about formation of the plasma within the receptacle;

at least two linkages, coupled to the RF coupling structure, the at least two linkages including a first linkage situated at a first position of the RF coupling structure and a second linkage situated at a second position on an opposite side of the RF coupling structure with respect to the first position to define a second axis through a center of the RF coupling structure between the first and second linkages to permit a plane of the RF coupling structure to pivot about the second axis and tilt toward the first axis.

19. The apparatus of claim 18, wherein the at least two linkages are configured to permit a portion of the RF coupling structure to pivot between 0.1 cm and 3 cm toward the receptacle.

20. The apparatus of claim 18, wherein the at least two linkages comprises a hinge.

* * * * *